United States Patent [19]

Medioni et al.

[11] Patent Number: 4,849,914
[45] Date of Patent: Jul. 18, 1989

[54] METHOD AND APPARATUS FOR REGISTERING COLOR SEPARATION FILM

[75] Inventors: Gerard G. R. Medioni, Beverly Hills, Calif.; Monti R. Wilson, Overland Park; Timothy F. Prohaska, Olathe; Lynn R. Poretta, Roeland Park, all of Kans.

[73] Assignee: Opti-Copy, Inc., Lenexa, Kans.

[21] Appl. No.: 99,800

[22] Filed: Sep. 22, 1987

[51] Int. Cl.$^4$ ............................................. G01S 13/00
[52] U.S. Cl. ................................. 364/526; 364/525; 364/559; 358/101; 358/107; 358/456; 382/8; 382/52; 382/54
[58] Field of Search ...................... 356/399, 400, 401; 364/526, 474.02, 463, 524, 525, 559; 358/75, 76, 77, 78, 79, 80, 101, 107, 283, 93; 377/17, 18; 226/3, 15, 16, 20, 21; 382/1, 8, 42, 44–46, 50, 52, 54; 83/30, 33, 13, 701

[56] References Cited

U.S. PATENT DOCUMENTS 4,641,244 2/1987 Wilson et al. .................. 364/475

Primary Examiner—William L. Sikes
Assistant Examiner—Frank González
Attorney, Agent, or Firm—Kokjer, Kircher, Bradley, Wharton Bowman & Johnson

[57] ABSTRACT

An algorithmic based method and apparatus for registering halftone color separations using edge based registration techniques. Digital pictures are taken at two locations on each film, and, following optimal thresholding of the data, the edges are located by application of a Laplacian of a Gaussian edge detection operator. Sampling is used to reduce the computational requirements, and full resolution is restored by interpolation. The edge locations are corrected for operator edge bias, and the corrected edge points are linked into segments which are registered by the parameter space method. The initial offset is corrected for size differences by application of least squares correction techniques.

39 Claims, 9 Drawing Sheets

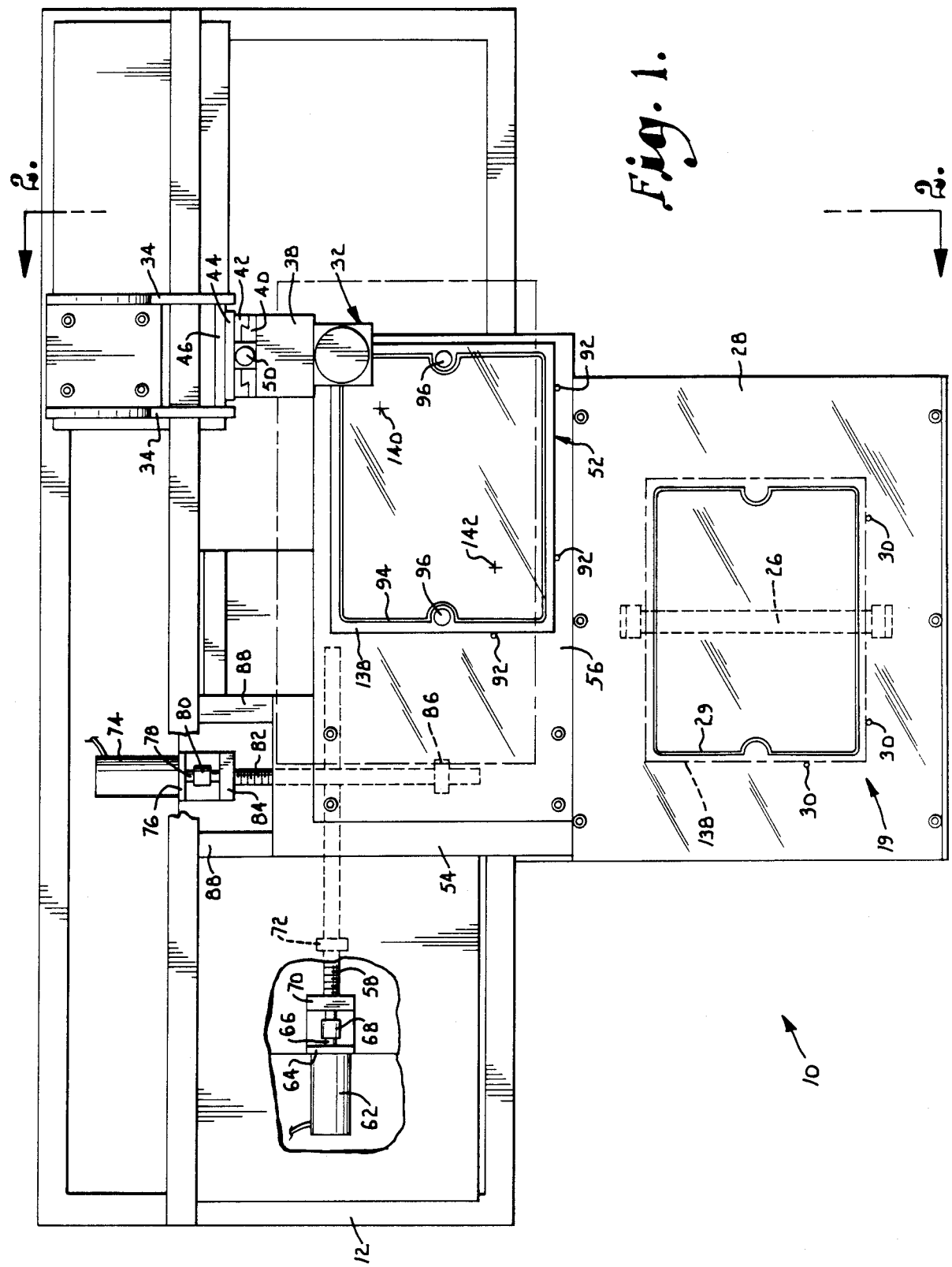

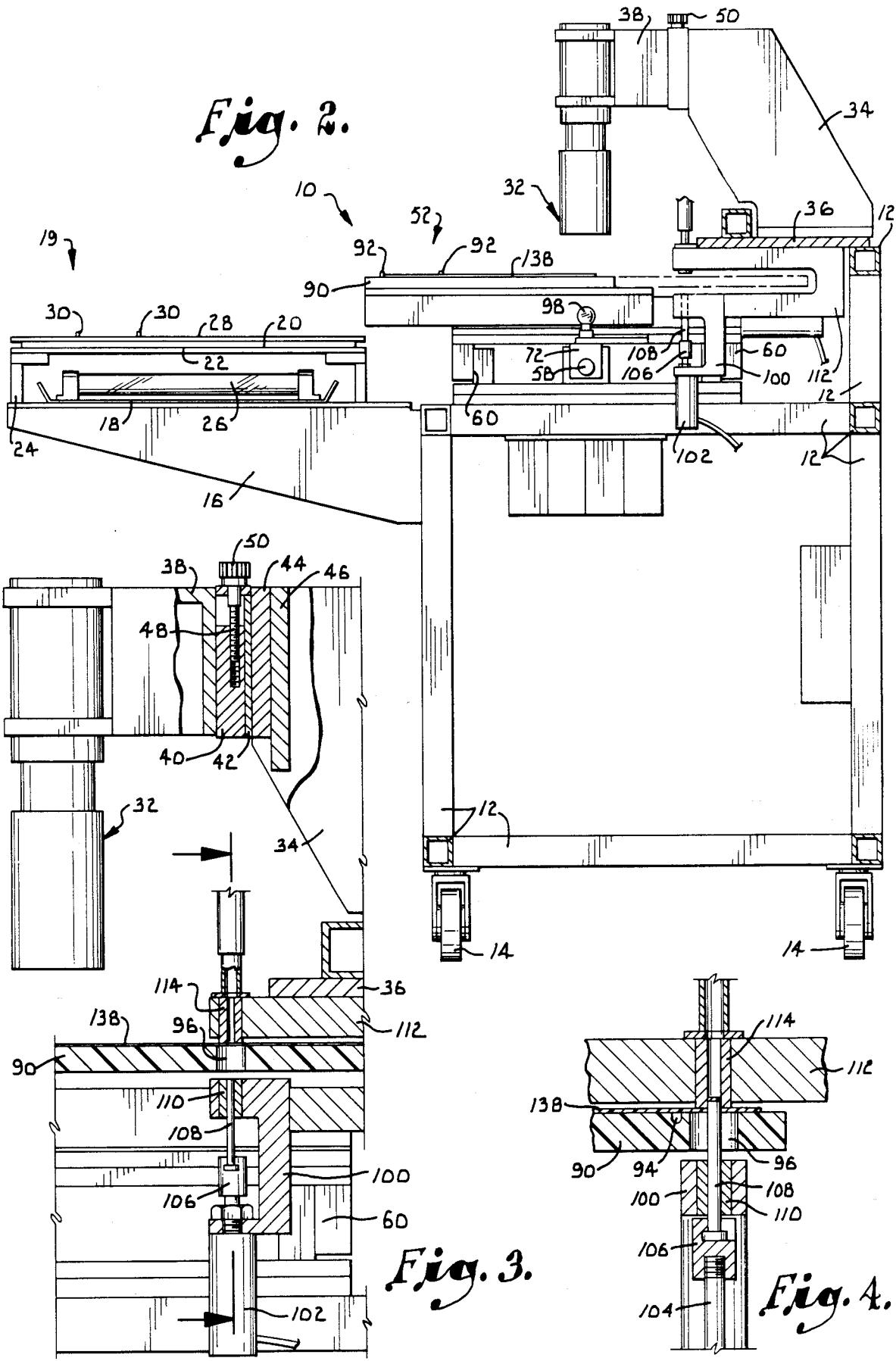

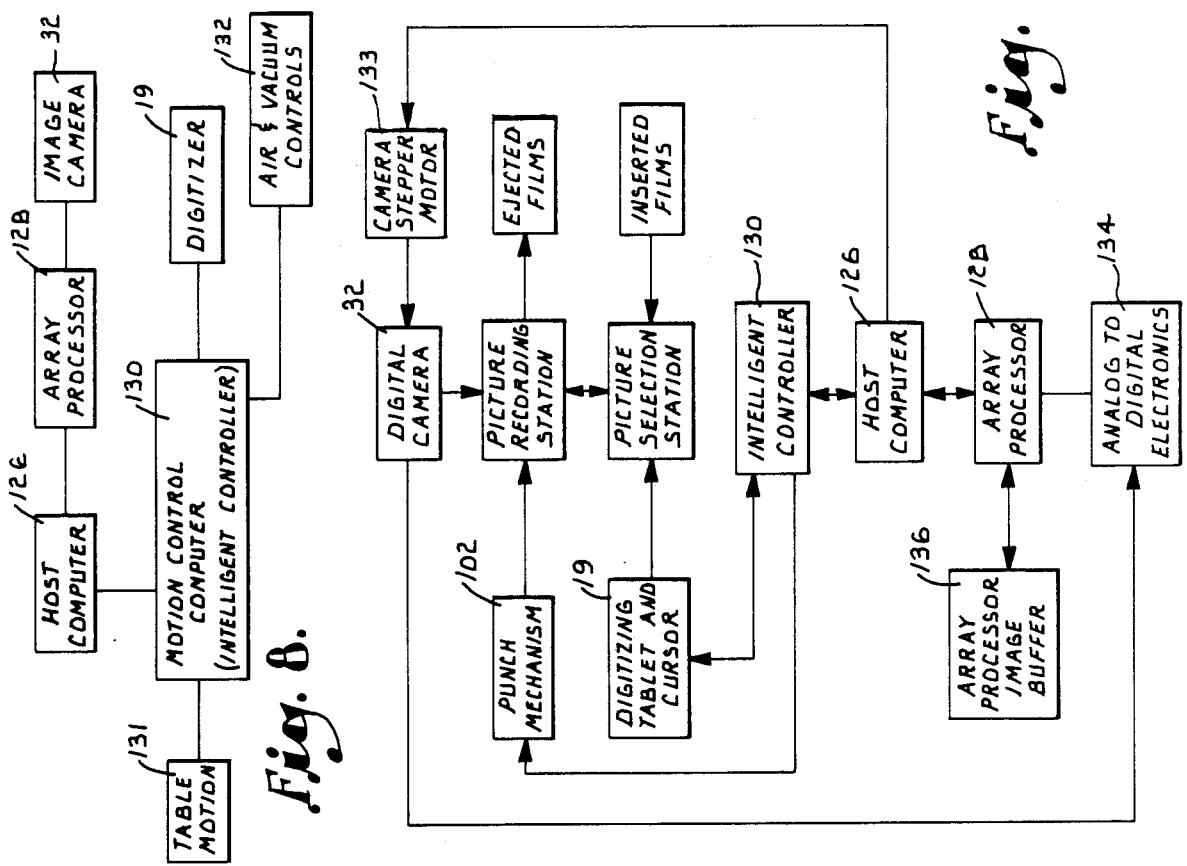
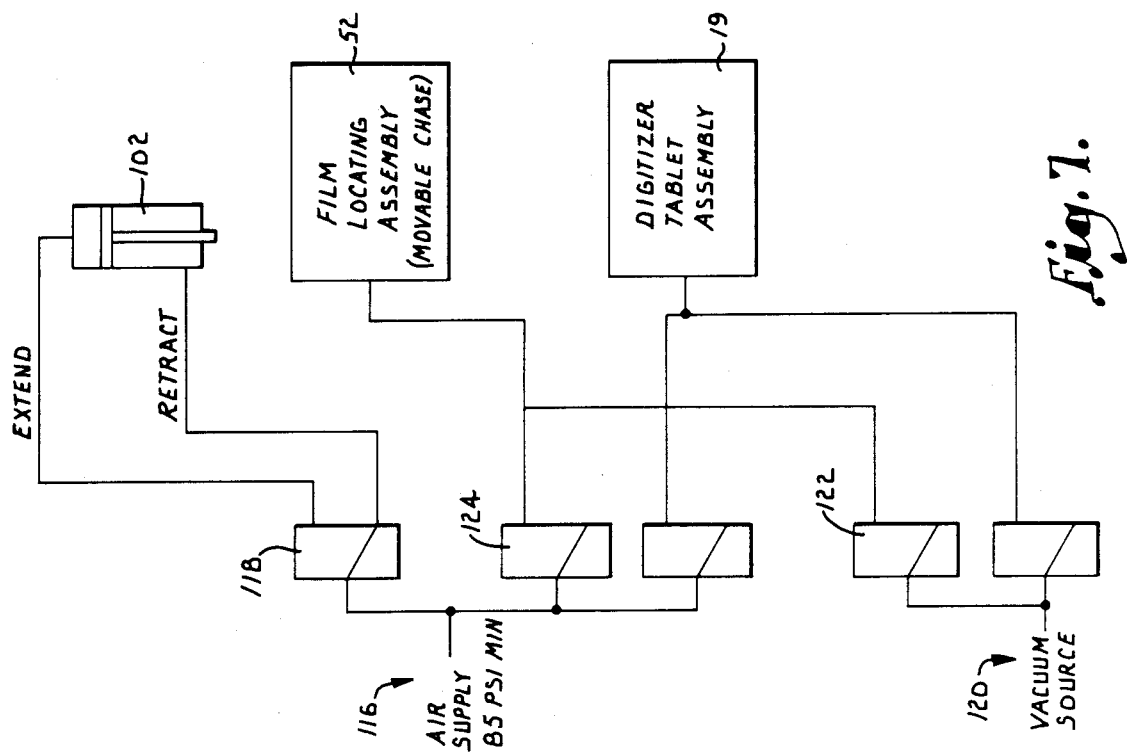

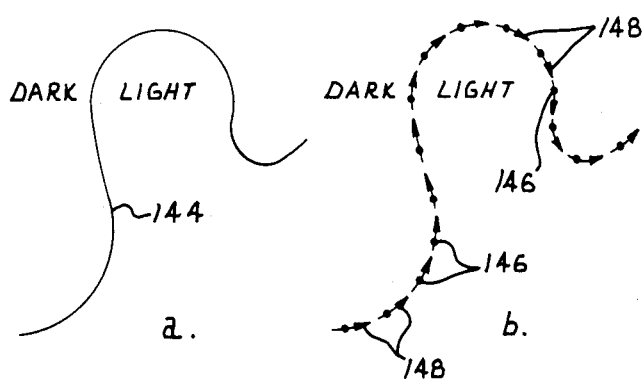
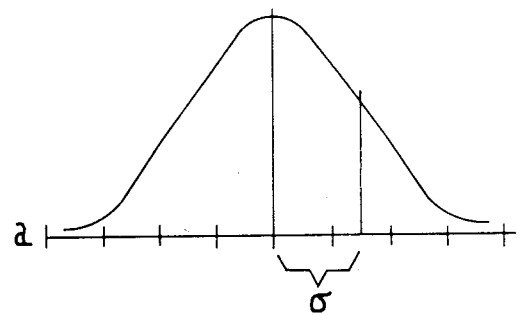
Fig. 11.
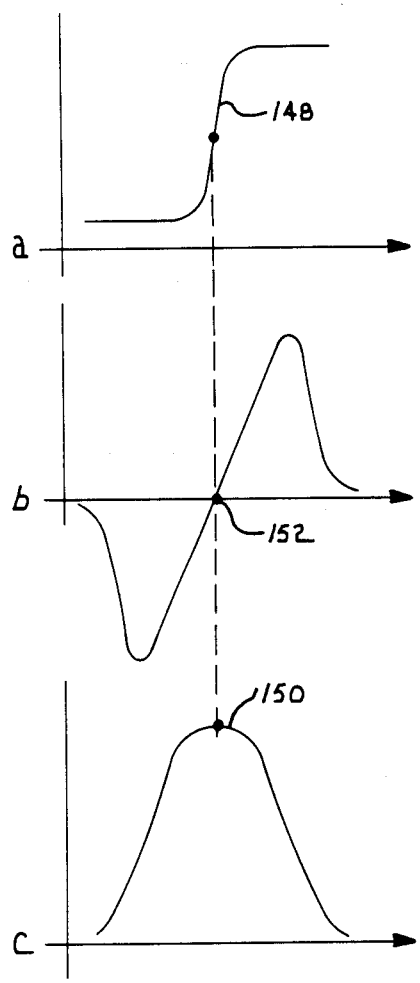
Fig. 12.
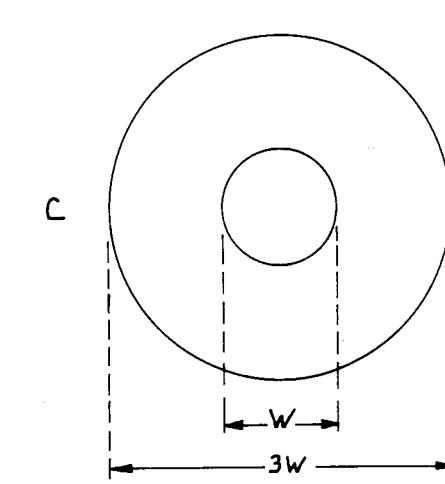
Fig. 13.
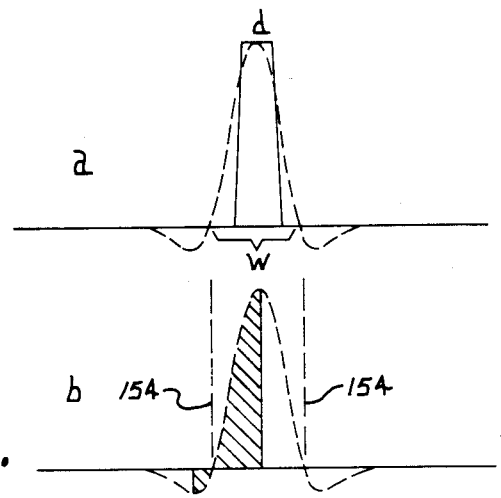
Fig. 14.

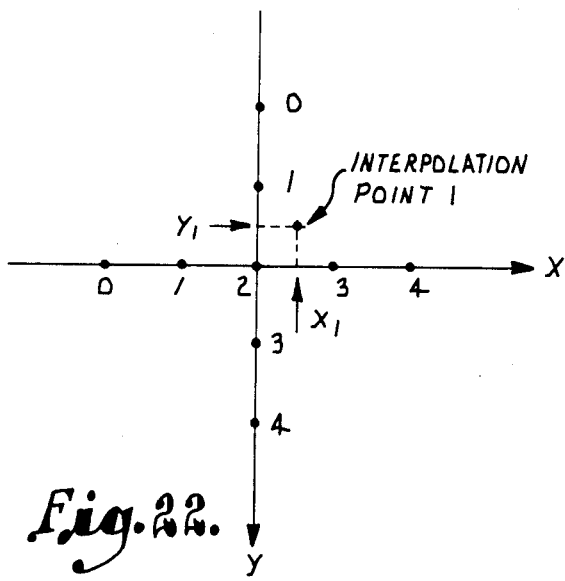
Fig. 22.
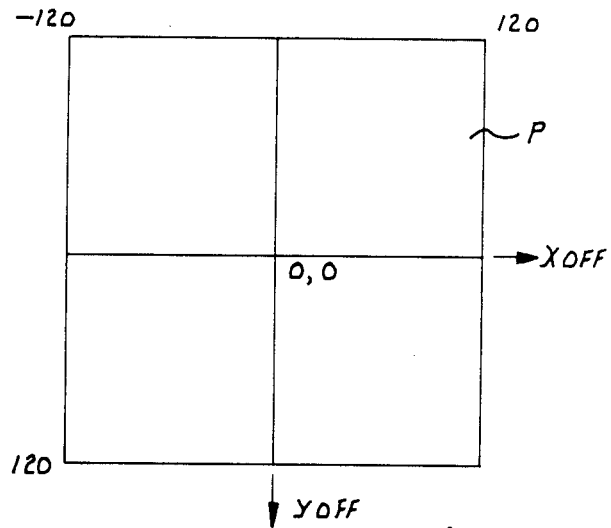
Fig. 23.
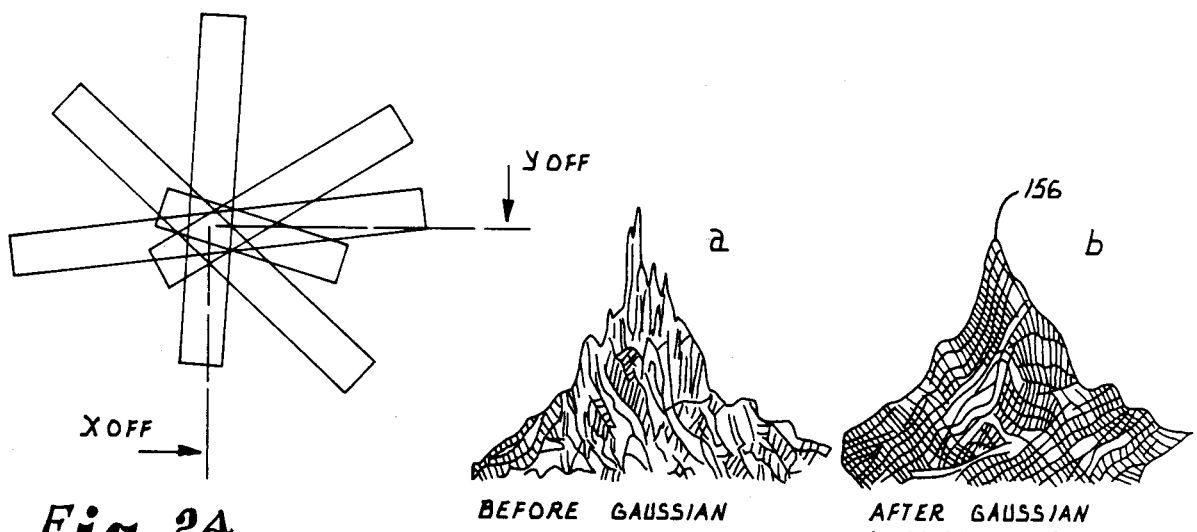
Fig. 24.
BEFORE GAUSSIAN CONVOLUTION SMOOTHING
AFTER GAUSSIAN CONVOLUTION SMOOTHING
Fig. 25.
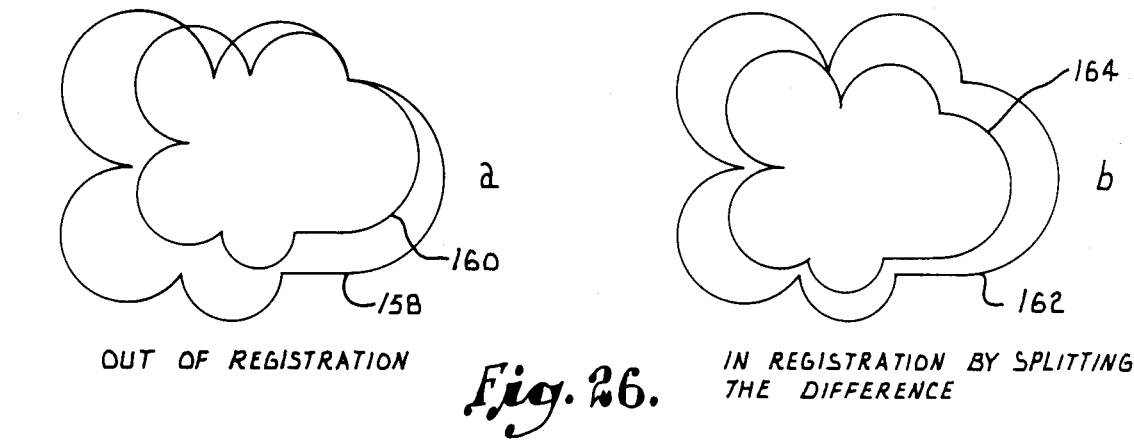
OUT OF REGISTRATION
IN REGISTRATION BY SPLITTING THE DIFFERENCE
Fig. 26.

METHOD AND APPARATUS FOR REGISTERING COLOR SEPARATION FILM

This invention relates in general to the field of graphic arts and more particularly to the registration of halftone color separation film. Still more particularly, the invention is directed to a method and apparatus for obtaining highly accurate and repeatable registration of color separation films in order to permit printing of high quality color pictures.

In the printing of high quality color photographs such as those which appear in mass circulation magazines and other publications where quality is of overriding importance, the color original is broken down into separate photographic images that are processed separately. The printed picture is a halftone picture in which the appearance of continuous tones is realized by breaking the picture detail up into halftone dots of varying sizes. In the commonly used four color process, the halftone color separations are four in number. Each color separation carries black and white tone information that reflects the process color content of the original color picture. The final reproduction requires that the four halftone color separation films be precisely registered or aligned so that the printed picture faithfully reproduces the original.

At present, process color registration is for the most part performed manually by highly trained persons referred to in the printing industry as strippers. The manual registration process involves taping or stripping the separation films (negatives or positives) to carrier sheets which are usually clear polyester film. The first reference color film is stripped to a prepunched carrier sheet. The film with the second color image is applied to a second overlaid prepunched carrier sheet, is visually aligned or registered with the first separation film, and is then stripped to the second carrier in the registered position. The third and fourth separation films are registered with the others by following the same procedure. Holes which are prepunched in the carrier sheets are placed on a pair of register pins in the contact frame to maintain the registration for the final reproduction.

The manual procedure for registering color separation films is subject to a number of shortcomings, mostly relating to accuracy. It is necessary for the stripper to register the separations to within a fraction of a row of halftone dots in each case, and this high degree of accuracy is difficult to obtain by even the most skilled and experienced strippers. In high quality printing, there are usually about 150 halftone dots per inch, and the center to center dot spacing is less than 7 mils. As can easily be appreciated, human error inevitably results from time to time, and poor quality picture reproduction often occurs. If an unacceptable registration is not discovered until press time, it is necessary to hold up the presses until the error is corrected. Press delays due to registration errors are inordinately expensive events which are to be avoided if at all possible.

Manual registration is also a tedious and time consuming process which is highly labor intensive. Typically, registration of four color separations requires between 9 and 20 minutes for a highly skilled and highly paid stripper to perform. Consequently, the labor costs contribute significantly to the overall costs. Consistency and reliability are also lacking because the quality of the registration is highly dependent upon the skill and vision of the individual stripper, and these can vary considerably. Even the same stripper cannot maintain the same level of accuracy from one job to the next due to the variations that are inherent in human performance capabilities.

Registration aids are sometimes used to magnify the halftone dot detail, but aids of this type add little to the accuracy. When a small portion of a halftone picture is magnified, it appears to the human eye to be a random collection of halftone dots rather than a recognizable picture. Therefore, picture details are often extremely difficult to align and this problem is aggravated by the difficulty the stripper has in making controlled muscle movements when viewing a magnified picture. A shaky hand or tired eyes can destroy registration, and this tendency increases with magnification. For these reasons, magnification aids are of limited utility and have not solved the problems that are inherent with manual registration.

In recent years, machines have been developed to either aid or replace the manual registration procedure. One machine is an optical-mechanical device having mechanical arms for movement of the carrier sheets and a magnified optical display for aiding the worker who performs the registration. Picture detail can be used as the basis for the registration, or special marks known as register marks can be used. The register marks are typically cross hairs located outside the field of the picture. Whether picture detail or register marks are used, this machine still relies on human skill and vision and is thus subject to many of the same problems that are associated with the strictly manual registration procedure.

Two other known machines rely on the register marks entirely in order to achieve registration. One of these machines is an electro-mechanical device having an electro-optical sensor which detects the centers of the register marks. Based on the information obtained by the sensor, the mechanical device moves one film into register with the other and then punches holes in the carrier sheets. The other machine is essentially a stripping robot that functions much like the electro-mechanical machine but tapes the separation films onto a prepunched carrier rather than acting to punch the holes itself. The basic problem with both of these latter two machines is that they rely wholly on the register marks to obtain registration. If the register marks are inaccurate, registration is also inaccurate. It is not uncommon for the register marks to be destroyed when the films are trimmed or otherwise processed, and missing registration marks render these machines completely useless. The register marks are also inaccurate at times, and this too destroys the accuracy of registration.

U.S. Pat. No. 4,641,244 which issued on Feb. 3, 1987 to Wilson et al. discloses an algorithmic based system for registering halftone films, and this system functions well for the most part. However, one problem that has been discovered results in inaccuracies in some situations. For example, the system disclosed in the above referenced patent experiences difficulty in accurately registering pictures that exhibit widely varying digital picture tones between common picture areas that are to be registered. Thus, if the picture areas to be registered entail a white square within a black background which is to be registered to a black square within a white background, the tones do not match at all and the system is not able to make the registration.

SUMMARY OF THE INVENTION

The present invention is directed to an improved algorithmic based method and apparatus which makes use of edge based registration techniques to register halftone pictures more reliably than occurs in the system of the above referenced patent. In accordance with the invention, the common macroscopic edges of two pictures to be registered are extracted and the edges are linked into line segments which can be optimally aligned. The process of optimally aligning the line segments provides a prediction of the offset required to achieve alignment or registration of one picture with the other picture.

The method and apparatus of the present invention makes use of a series of algorithmic steps which are carried out by a digital computer, the computing power and speed of which are taken advantage of in order to carry out the registration. After the gray level pictures of the halftone films have been optimally thresholded by known techniques, the macroscopic edges are extracted through application of a Laplacian of a Gaussian (LOG) convolution filter having a width parameter $\theta$ that is adjusted to detect only macroscopic edges and not the edges around the individual halftone dots.

Preferably, the zero crossings of the LOG output are found at ⅓ resolution in order to reduce the computational time without sacrificing accuracy. Full resolution is restored by accurately interpolating the reduced resolution zero crossings to the nearest original image pixel. The final interpolated zero crossings (edge locations) are corrected for the positional bias that is inherent in the LOG operator. Linear segments are then produced by linking and tracing the edges and approximately these connected edges by line segments, fit within a given tolerance.

Finally, the segments are registered in a two stage process which first involves initial registration accomplished by the parameter space method (PSM). The second stage involves correction for size differences by "splitting the difference" using a quadratic form formulation of the least squares problem, thereby minimizing the mean distance between matching segment pairs.

By determining, for both of two selected pictures on each film, the offset of one picture (referred to as the moved picture) required to bring it into registration with the other picture (reference picture), the films can be punched at locations to assure they will register when overlaid on registration pins. Consequently, the halftone pictures can be assembled in registered position, and the quality of the final product is enhanced due to the accuracy of the registration and the repeatability provided by the method and apparatus of this invention.

The final algorithmic step, in fact, is the computation of the punch hole locations, for each non-reference film, based on the registration offset data for both of the two selected pictures. Basically, this final algorithm computes the translation and rotation transformation required to suitably align a vextor on each non-reference film (between picture points) with the corresponding vector connecting the analogous picture points on the reference film. If the vector to be moved is $\vec{M}$ and the reference vector is $\vec{R}$, the registration offset data computed by the method of this patent application is simply the difference $\vec{R}-\vec{M}$ between vector tips and tails prior to final registration. The final registration transformation is then applied to the reference punch hole locations to determine the table motion required to punch holes on each film to be registered to the reference film.

One version of this vector alignment algorithm was described in U.S. Pat. No. 4,641,244 which issued on Feb. 3, 1987 to Wilson et al. There are, however, numerous other ways to implement the vector alignment.

DESCRIPTION OF THE DRAWINGS

In the accompanying drawings which form a part of the specification and are to be read in conjunction therewith and in which like reference numerals are used to indicate like parts in the various views:

FIG. 1 is a top plan view of a digital registration machine constructed to effect registration of color separation films according to a preferred embodiment of the present invention, with some components shown in broken lines and portions broken away for purposes of illustration;

FIG. 2 is a sectional view taken generally along line 2—2 of FIG. 1 in the direction of the arrows;

FIG. 3 is a fragmentary sectional view on an enlarged scale showing the digital camera and mechanical punch which are included in the machine;

FIG. 4 is a fragmentary sectional view on an enlarged scale taken generally along line 4—4 of FIG. 3 in the direction of the arrows;

FIG. 7 is a schematic circuit diagram of the pneumatic system of the machine;

FIG. 8 is a simplified block diagram of the control components which control the operation of the machine;

FIG. 9 is a somewhat more detailed block diagram of the control components of the machine;

FIG. 11a is a diagrammatic illustration of a macroscopic edge contour which separates dark and light regions of a digital picture;

FIG. 11b is a diagrammatic illustration showing the edge contour of FIG. 11a detected at discrete edges, with the arrows indicating the edge direction;

FIG. 12a is a diagrammatic illustration of a step edge contour;

FIG. 12b is a diagrammatic illustration of the convolution response of the step edge of FIG. 12a to a second derivative operator;

FIG. 12c is a diagrammatic illustration of the convolution response of the step edge of FIG. 12a to a gradient operator;

FIG. 13a is a diagrammatic illustration depicting the profile of a Gaussian operator;

FIG. 13b is a diagrammatic illustration depicting the profile of a Laplacian of a Gaussian operator;

FIG. 13c is a diagrammatic illustration depicting a plan view of the Laplacian of a Gaussian operator;

FIG. 14a is a diagrammatic illustration depicting the profile of a Laplacian of a Gaussian operator superimposed on the profile of a bright feature having a width less than the width of the operator;

FIG. 14b is a diagrammatic illustration depicting the convolution response of the feature of FIG. 14a to the Laplacian of a Gaussian operator;

FIG. 22 is a diagrammatic illustration depicting data points that form the basis for Lagrange polynomial interpolation in accordance with the invention;

FIG. 23 is a diagrammatic illustration depicting the accumulator array P employed in the parameter space method of segment registration;

FIG. 24 is a diagrammatic illustration depicting qualitatively the overlap in score painting windows which creates a peak in the PSM parameter space;

FIG. 25 is a diagrammatic illustration depicting the parameter space score profiles before and after Gaussian smoothing;

FIG. 26 is a diagrammatic illustration depicting improper and proper registration of a pair of "blobs" of detail;

DETAILED DESCRIPTION OF THE INVENTION CONSTRUCTION OF THE MACHINE

Figure 5:
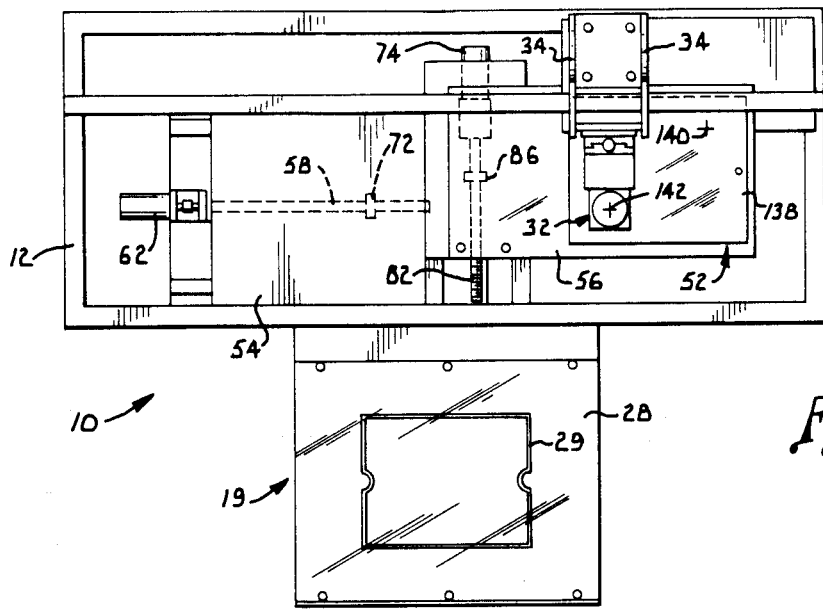
FIG. 5 is a top plan view on a reduced scale showing the movable chase of the machine in position for recording of the image at one registration point centered beneath the camera.
Figure 6:
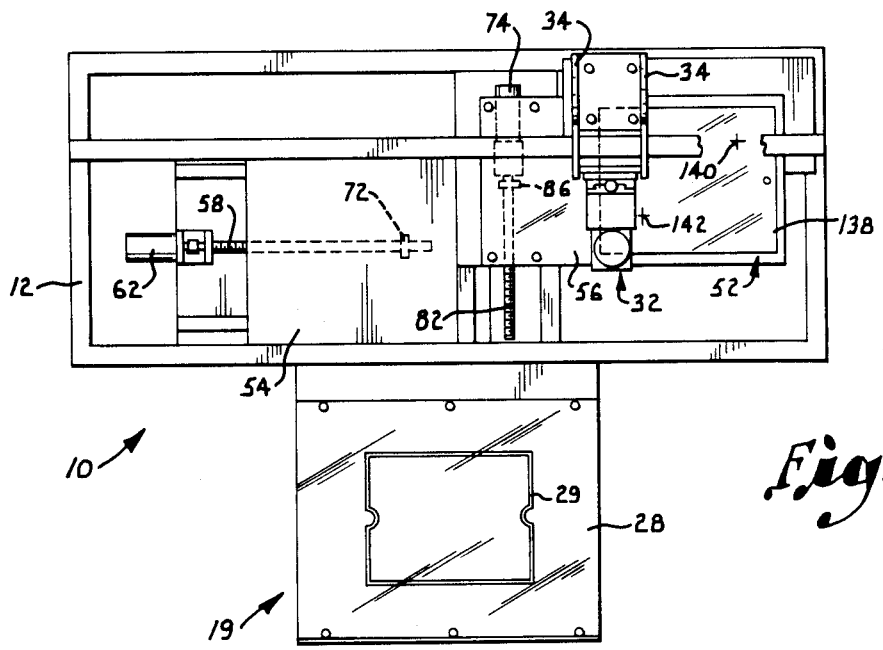
FIG. 6 is a top plan view similar to FIG. 5, but showing the chase in position for punching of one of the registration holes.

Referring now to the drawings in more detail and initially to FIGS. 1-6, numeral 10 generally designates a film registration machine constructed in accordance with a preferred embodiment of the present invention.

The machine 10 has a rigid frame which is formed by a plurality of interconnected square tubes 12. A plurality of caster wheels 14 are connected with the lower frame members 12 to permit the machine to be easily moved. Extending forwardly from the frame of the machine are brackets 16 on which a horizontal table 18 is mounted. The table 18 supports digitizer tablet assembly which is generally designated by numeral 19. A digitizer tablet 20 rests on a transparent plate 22 forming the top of an enclosure 24 which is illuminated by a light bulb 26 located within the enclosure and below the digitizer tablet 20. Overlying the digitizer tablet is a transparent plate 28 having a vacuum channel 29 and three upwardly projecting alignment pins 30.

The digitizer tablet 20 is a conventional device which registers and records locations selected by a cooperating hand held cursor (not shown). When the cursor is aligned with a selected location over the digitizer tablet 20 and activated, the digital location of the selected point is registered. Preferably, the cursor has a resting place on a cradle, and the vacuum channel 29 is deactivated when the cursor is in place on its cradle. However, when the cursor is removed from the cradle, the vacuum is automatically applied to channel 29 in order to hold plastic carrier sheets for the films down on the plate 28, as will be described more fully.

A digital camera 32 is mounted in a fixed position on the frame of the machine. The camera 32 is preferably a line scan CCD (charge couple device) digital camera having a stepping motor for causing the camera to linearly scan the elements of the pictures which are recorded by the camera. Preferably, the camera records $640 \times 640$ pixel digital pictures, with each pixel being 13 microns square. The stepping motor for the camera is controlled by a microprocessor.

The digital camera 32 is mounted on a pair of brackets 34 which are bolted or otherwise secured to a horizontal mounting plate 36. The mounting plate is in turn supported on the frame of the machine. The camera 32 is carried on a bracket 38 which connects with a dovetail 40. The dovetail fits in a vertical dovetail groove formed in a block 42 which is connected with the mounting brackets 34 by a pair of plates 44 and 46. An adjustment screw 48 is threaded into the dovetail 40 and carries a knob 50 to facilitate adjustment of the screw. Due to the threaded connection between screw 48 and the dovetail 40, turning of knob 50 causes the dovetail to move up and down in the dovetail groove in order to raise and lower the digital camera 32.

A movable chase 52 is carried on a positioning table assembly formed by one table 54 which is restricted to movement in the "x" direction and another table 56 which is restricted to movement only in the "y" direction. The x table 54 is moved by a drive screw 58 and is restricted to linear movement by guide bearings 60. The drive screw 58 is turned by a reversible electric motor 62 which is attached to a mounting plate 64 and which drives an output shaft 66. A coupling 68 connects the output shaft 66 with the drive screw 58, and a bearing 70 supports the drive screw for rotation. The drive screw 58 is threaded through a nut 72 secured to the x table 54 such that turning of the drive screw in opposite directions moves table 54 linearly in opposite directions.

The y table 56 is driven similarly with its motion restricted to a direction perpendicular to the direction of motion of the x table 54. A reversible electric motor 74 mounted on a plate 76 has an output shaft 78. Shaft 78 is coupled at 80 to a drive screw 82 which is supported to rotate by a bearing 84. Screw 82 is threaded through a nut 86 secured to the y table 56. Guide bearings 88 restrict the y table 56 to linear movement.

The movable chase 52 includes a transparent plastic plate 90 having three upstanding alignment pins 92 which serve to properly locate the carrier sheets which are placed on the chase. The plate 90 also has a vacuum channel 94 for holding of the carrier sheets down on top of the chase when vacuum is applied. Plate 90 is provided with a pair of holes 96 which permit the carrier sheets to be punched in a manner that will be explained in more detail. A DC light bulb 98 is located immediately below camera 32 in order to provide illumination during recording of pictures.

Punching of the carrier sheets is effected by a punch mechanism which is mounted on a C-shaped bracket 100. The punch bracket 100 is suitably mounted on the frame at a location below the camera mounting brackets 34. The punch mechanism includes a pneumatic cylinder 102 which is secured to the lower arm of bracket 100 and which has an extendable and retractable rod 104. A spool 106 is threaded onto the top end of the rod 104, and a punch 108 is detachably carried by the spool 106. The punch 108 has a head which can be fitted into a slot formed in the spool in order to maintain the punch in position.

The punch 108 extends through a bushing 110 which is carried by the upper arm of the bracket 100. A C-frame 112 has its upper arm located above bracket 100 so that the transparent plate 90 can be extended between bracket 100 and the C-frame 112 during the punching operation, as best shown in FIGS. 3 and 4. A die 114 is carried on the C-frame 112 and is aligned directly above bushing 110 such that the top end of the punch 108 enters sleeve 114 when the punch is extended as shown in FIG. 4. It should be noted that more than one punch can be provided if desired.

FIG. 7 shows the pneumatic system which controls the application of air and vacuum to the various components of the machine. A suitable air supply 116 connects through a solenoid valve 118 with the extend and retract sides of the punch cylinder 102. When valve 118 is in the position shown in FIG. 7, the air supply 116 is connected with the retract side of cylinder 102 and the cylinder is retracted to the position shown in FIG. 3. However, when the valve 118 is shifted, the air supply 116 connects with the extend side of cylinder 102 and the cylinder is extended to the position of FIG. 4 to punch one of the film carrier sheets.

A suitable vacuum source 120 connects through a solenoid valve 122 with the vacuum channels 29 and 94 for the digitizer tablet assembly 19 and the movable chase 52. When valve 122 is shifted from the position shown in FIG. 7, vacuum is applied to the vacuum channels in order to hold down any carrier sheets that are then in place on the digitizer tablet 20 or the movable chase 52. The air supply 116 may also be connected with channels 29 and 94 through a solenoid valve 124. Valve 124 is normally in the position of FIG. 7 and then disconnects the air supply from the vacuum channels. However, when valve 124 is shifted, air under pressure is applied to the vacuum channels to eject any carrier sheets that are in place on the digitizer tablet or movable chase.

FIG. 8 is a simplified block diagram of the control components used to control the registration process which is carried out by the machine 10. A host computer 126 supervises the recording and the intermediate storage of digital pictures recorded by the camera 32. The digital picture data is transferred from the camera 32 into a high speed array processor 128 which is a specialized computer having the ability to quickly perform the necessary numerical computations. A programmed microprocessor serves as an intelligent controller 130 which receives commands from the host computer and controls through block 131 the drive motors 62 and 74 for the positioning tables 54 and 56. The intelligent controller 130 also controls the air and vacuum through block 132 and receives data from the digitizer 19 specifying the locations which are selected thereon by the cursor.

FIG. 9 is a more detailed block diagram of the control components of the machine. As shown, the host computer 126 controls the stepping motor (block 133) for the digital camera 32. Digital image data from the camera is transferred via an analog to digital electronics block 134 to the array processor 128. The array processor has a memory 136 which function with a fast recall capability.

Operation Of The Machine

The machine 10 operates to register process color films such as the four halftone color separations used in the four color process which is commonly used in the reproduction of high quality color photographs. The operator of the machine first typically selects either the cyan or the magenta process color films as a reference, and the reference film is taped or otherwise mounted to a clear unpunched polyester carrier sheet such as the sheet 138 which is shown in the drawings in place on the chase 52. The other three separation films are similarly taped or mounted on unpunched polyester carrier sheets in rough register with respect to the reference film when all of the carrier sheets are arranged in alignment. The purpose of the rough register is to achieve an initial alignment of the films that is comfortably within the detection range of the algorithm. Typically, the rough register need only be done to within plus or minus 40 mils. Rotation of the line (vector) between selected pictures is taken into account by the final registration transformation previously described in the summary of the invention. Rotational misregistration between corresponding selected pictures is very small and can be initially ignored. The least squares segment matching step does, however, also take rotational alignment into account.

The operator then places the reference carrier over the digitizer tablet 20 located at the picture selection station. Two edges of the carrier sheet are positioned against the three alignment pins 30, as shown in the phantom view of the carrier sheet 138 in FIG. 1. The operator then raises the cursor off of its cradle in order to activate the vacuum channel 29 in plate 28, thereby holding the carrier sheet 138 in place by suction.

The operator uses the cursor to select two spaced apart register points on the film which is carried on sheet 138. Either or both of the register points can be the approximate center of a register mark which is usually in the form of a hairline cross located outside the boundary of the picture. However, if register marks are not present on the film or are present but considered to be inaccurate, areas containing halftone dot detail can be selected for one or both register points. Ordinarily, areas of the picture which contain considerable macroscopic edge detail are selected. When the first register point 140 has been selected, the cursor is placed at the first register point on the digitizer tablet 20, and the number one cursor button is depressed to record the location of the first register point. The digitizer tablet 20 then transmits the location to the host computer. The second register point 142 is thereafter selected and recorded in the host computer by aligning the cursor with it and depressing the number two button on the cursor.

After both register points 140 and 142 have been selected, the operator returns the cursor to its cradle, thereby releasing the vacuum at channel 29. The reference carrier sheet 138 is then moved by the operator from the digitizer tablet onto the movable chase 52. Two edges of the carrier sheet 138 are positioned against the alignment pins 92, as best shown in FIG. 1, and a foot switch or another switch is activated to apply vacuum to the vacuum channel 94. The vacuum thereafter holds the carrier sheet 138 in place against the alignment pins 92. At this time, the movable chase 52 is in the load/unload position shown in FIG. 1.

The machine then begins automatic operation initiated by the closing of a door on the carrier sheet 138 or by activation of another switch. Under the control of the intelligent controller 130, the positioning table drive motors 62 and 74 are activated to move chase 52 until the first register point 140 is centered immediately below the camera 32. The camera records a digital picture of the area of the film centered at the register point 140, and the picture data are transferred to the host computer 126 and analyzed by the array processor 128 using high speed algorithms which will be described in more detail.

The motors 62 and 74 are then activated again to align the second register point 142 with the lens of the digital camera 32. The digital camera records a picture centered at point 142, and the data in the picture are transferred to the host computer and analyzed by the array processor 128. The chase 52 is then moved until the hole 96 near its right edge is centered above the punch 108. The punch mechanism is activated by the intelligent controller, and cylinder 102 is extended to punch a register hole in the carrier sheet 138 for the reference film. After the punch has been retracted, the chase is shifted until the hole 96 near its left edge is centered above the punch, and the punch is then activated again to punch a second register hole in the reference carrier sheet 138. When the punching operation has been completed, the movable chase 52 is returned to the load/unload position shown in FIG. 1, and the vacuum is removed so that the reference carrier sheet 138 can be removed by the operator (or automatically ejected if desired). It should be noted that both of the register holes can be punched at the same time by two different punches if desired.

After the reference film has been removed from chase 52, the carrier sheet for the second film is placed on the chase with its edges against the alignment pins 92. The vacuum channel 94 is then activated and automatic operation of the machine is initiated. The chase 52 is moved until the location on the second carrier sheet corresponding to point 140 is centered beneath the camera 32. The camera records a picture, transfers the picture data to the host computer, and the data are analyzed by the high speed array processor 128. The chase is then moved to center a second point which corresponds with the register point 142 beneath the camera 32. Another picture is recorded and analyzed by the array processor 128.

By using the algorithmic processes to be explained hereinafter, computations are made based on the picture data to provide the locations at which the second carrier sheet must be punched in order to effect registration of the second film with the reference film. Based on these calculations, the chase 52 is properly positioned relative to punch 108 such that the two punched holes made in the second carrier sheet, when aligned with the punched holes in the reference carrier sheet, result in alignment between the second film and the reference film. After these two register holes have been punched in succession in the second carrier sheet, chase 52 is returned to the load/unload position, the vacuum is released, and the second carrier sheet is removed by the operator or ejected from the chase.

The carrier sheets which hold the third and fourth color separation films are handled in the same manner as the second carrier sheet. When all of the register holes have been punched (two in each carrier sheet), the four carrier sheets can be "laid up" on register pins with assurance that the four color separation films are in registration for final reproduction of the color photograph. Because the films are initially only in rough alignment, the picture detail recorded at each register point is somewhat out of registration but can be used in the algorithmic process to achieve exact registration.

The Algorithmic Processes Used In The Edge Based Registration Technique

Figure 10:
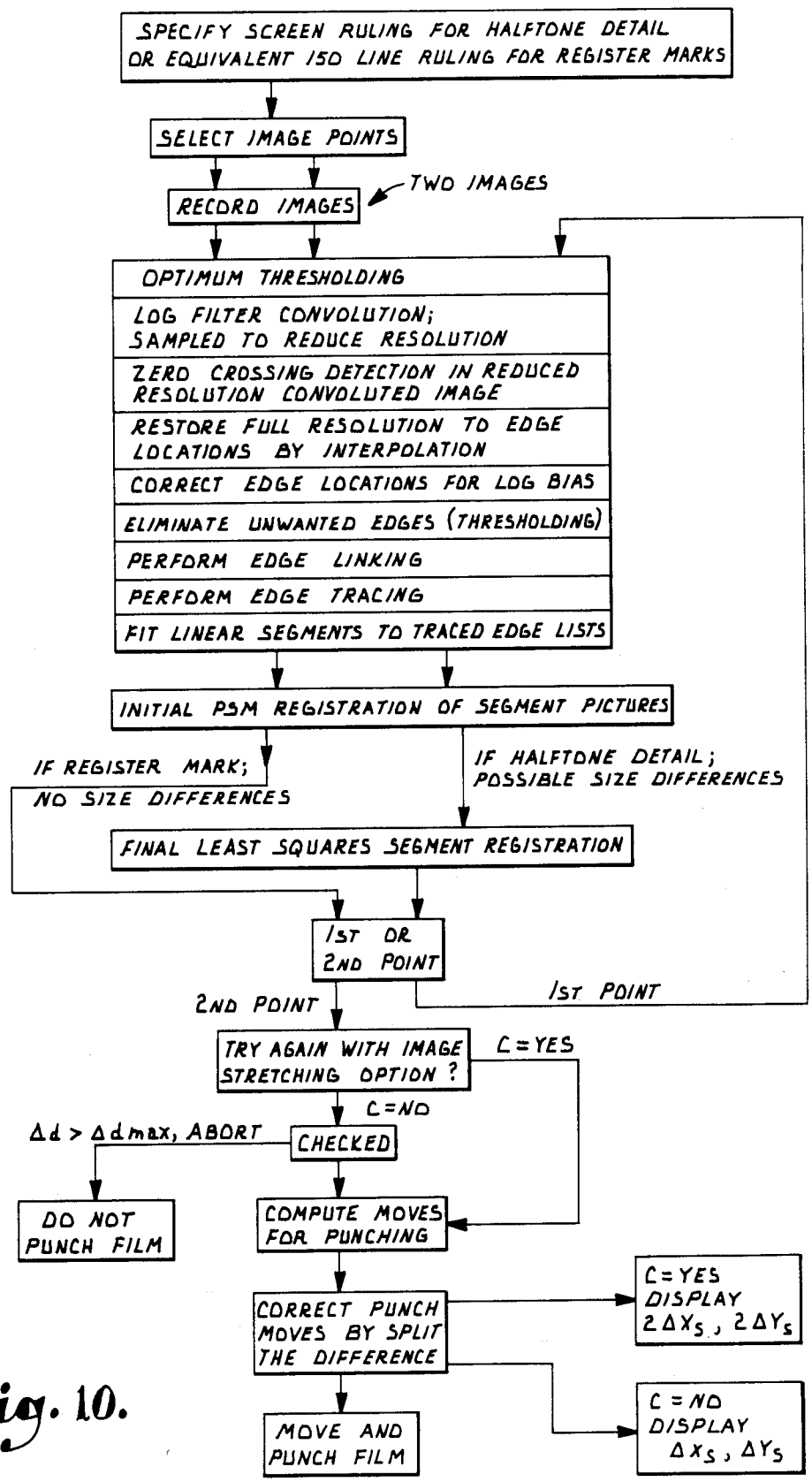
FIG. 10 is a flow chart for the algorithmic process which is performed by the machine to effect registration of halftone color film separations.

FIG. 10 is a flow chart which depicts the algorithmic processes that are carried out by the machine 10 in order to achieve registration of the four color separation films. The screen ruling for the halftone dot detail is initially specified (or the equivalent 150 line screen ruling for register marks). A 150 line screen is typically used for halftone pictures, although screen rulings in the range of about 120 to 200 can be used without placing undue strain (storage capacity and computer time) on the computer code implementation that has been developed.

The digital camera calibration may be 1:1, although other calibrations are possible. The camera 32 operates with square 13 micron pixels (about 0.51 mils). The raw data picture recorded by the camera at each selected register point is approximately 640×640 pixels and is centrally located in the field of view of the camera in order to achieve maximum image quality.

The Optimal Thresholding Algorithm

The raw data image that is recorded by the camera 32 at each register point on each halftone separation sheet is a gray level picture which is optimally thresholded to a binary picture. The gray level picture has different shades of gray ranging from 0 (black) to 255 (white). Optimal thresholding reduces this raw data gray level picture to a two level (binary) picture having two tones, namely black (tone one) and white (tone zero). The black tone is assigned to all tones less than the threshold while white represents tones greater than or equal to the threshold.

The technique for performing the optimal thresholding is well known (see *Digital Image Processing* by Gonzales and Wintz, 1977, p. 327). First, an estimate for the threshold is obtained by averaging the maximum and minimum gray tones in the raw data picture. This initial threshold is used to separate the tones into black and white groups with numbers above or equal to the initial threshold considered white and numbers below the initial threshold considered black. The average white tone and the average black tone is then found. By averaging the average black tone and the average white tone, the optimum threshold is found. A final thresholding is performed using the optimum threshold determined by this procedure. The thresholding is performed row by row on the pixels in the raw data picture.

Thresholding in this manner eliminates gray scale variations that may be introduced by the digital camera electronics and/or the camera light source. In accordance with the edge based registration technique utilized in the present invention, the macroscopic edge detection operates on a scale that is greater than the fine detail of gray level transitions at individual halftone dot edges. Therefore, the weakness of the thresholding with respect to the resolution of individual dot edge pixels (an edge pixel may be partly on and partly off of a camera sensor element) does not adversely affect the registration result to a significant extent. The binary detail of the halftone pictures is extracted by the thresholding and is thereafter independent of gray level fluctuations.

Decimated Large LOG Convolution

In accordance with the present invention, macroscopic edges of the digital pictures are detected and registered using special edge based registration techniques. In viewing a picture or any graphic image, an edge contour traces the occurrences of intensity changes in the picture. Such a contour is depicted in FIG. 11a where there is a marked change in intensity from dark to light on opposite sides of the edge 144. If the edge contour is detected only at discrete points, each edge point (referred to as an edgel) represents a local intensity change with an associated edge orientation or direction. The edge direction is perpendicular to the maximum rate of intensity change at each edgel. The edge direction depends upon whether the intensity change perpendicular to the edge is from light to dark or dark to light in a sense chosen by convention. FIG. 11b depicts the same edge shown in FIG. 11a but detected by a plurality of edgels 146. The directional arrows 148 point in the direction of the edge as determined by the direction of the intensity change considered in accordance with the convention which determines the direction in which the arrows point.

Edge detectors may be classified in two broad classes: gradient operators and second derivative operators. FIG. 12a depicts a step edge 148 where the intensity change takes on the shape of a step. FIGS. 12b and 12c respectively illustrate the responses of the step edge 148 when operated on by a second derivative operator and a gradient operator (convolution of the edge detector filter with the edge). The gradient operator (FIG. 12c) provides a broad peak 150 at the location of the step edge, and the gradient operator thus requires a thinning or maximum detection step that degrades the resolution. On the other hand, the second derivative operator (FIG. 12b) responds with a zero crossing 152 at the location of the step edge, and the accuracy of location by interpolation depends on the signal to noise ratio. In addition, gradient operators detect edges in only one direction, and it is often necessary to carry out multiple convolutions with different operators in order to locate all edges in 111 directions.

The techniques employed in the present invention include the use of a second derivative operator known as the Laplacian of a Gaussian (LOG) operator first suggested by D. Marr and E. Hildreth in a paper entitled "Theory of Edge Detection", presented in the Proceedings of the Royal Society of London in 1980 (pages 187-217). The LOG edge operator is written as:

$$LOG = 0.5(2 - r^2/\sigma^2)\exp(-r^2/2\sigma^2), \quad (1)$$

where $\sigma$ is the width parameter of the operator (the space or decay constant of the Gaussian) and $\sigma$ is the two dimensional radius of the operator $r = \sqrt{(x^2 \times y^2)}$.

The LOG edge detector is rotationally invariant and requires only one convolution to enable detection of all edges in all directions. At a zero crossing, the edge direction perpendicular to the maximum slope of the zero crossing response is determined by examining a $3 \times 3$ pixel window (local neighborhood) centered at the pixel containing the zero crossing.

FIG. 13a depicts the profile of the Gaussian and the width parameter $\sigma$, while FIG. 13b shows the LOG profile. FIG. 13c is a plan view of the LOG operator and shows the width w of the excitatory (positive) region of the operator as well as the truncation of the operator to a size of 3w. Because the LOG has infinite spatial extent, it must be truncated to be useful for practical calculations. Setting the factor $0.5[2 - (r^2)/\sigma^2]$ equal to zero yields $w = 2\sqrt{2}\,\sigma$ (w is the diameter or 2r or $2\sqrt{x^2 + y^2}$).

Thus, truncating the size of the LOG to 3w truncates it to approximately 8.5 $\sigma$. Since 99.7% of the area under a one dimensional Gaussian lies between plus and minus three standard deviations from the mean, truncating the LOG operator to 3w or 8.5 $\sigma$ introduces virtually no error. In actual practice, the LOG is adjusted slightly so that the response to a uniform stimulus is exactly zero. Moreover, the 3w size is in actuality larger than is necessary for accurate results, and its use consumes valuable computer time that is not necessary. Consequently, a LOG size of $2\pi\sigma$ is selected for use, and the odd integer nearest to $2\pi\sigma$ becomes the discrete size in pixels of a symmetric (odd mask size), square, gridded convolution filter mask M that is evaluated (at each discretized radius) from the LOG formula (1). The adjustment to zero uniform mask response is accomplished by modifying each positive element in the original mask M by a factor 1—sum/(positive sum), where the term "positive sum" is the sum of positive elements in the original mask M and the term "sum" is the original sum of all mask elements. The mask M so corrected has an exactly zero sum.

The principal virtue of the LOG operator as applied to halftone image registration is that by properly adjusting the width w (or $\sigma$), only the desired global or macroscopic edges will be detected, and the edges around individual halftone dots will not be detected. A $\sigma$ that is too small would detect individual halftone dot edges, and this would destroy image registration because individual halftone dots on two different color separations of the same image do not overlay or register with one another. In fact, the superimposed dots of all of the color separations form a rosette pattern. The visual or macroscopic edges detected by the LOG operator with a suitably large $\sigma$ register in much the same way as edge detail is visually aligned in manual registration procedures performed by skilled personnel.

The zero crossing contours of features having a width smaller than w are displaced and may become fused with the zero crossing contours of nearby features. When the feature width is d (the width or diameter of a halftone dot), the fusion of zero crossing contours provides the mechanism for detecting only macroscopic edges and not individual dot edges. This fusion phenomenon also provides a simple method for initially estimating the proper $\sigma$ to use for each screen ruling. FIG. 14*a* illustrates LOG profile superimposed on the profile of a bright feature having a width d less than w. FIG. 14*b* shows the LOG convolution and illustrates that the zero crossings 154 of the response are displaced from the edges of the feature by a distance of $(w-d)/2$.

Figure 15:
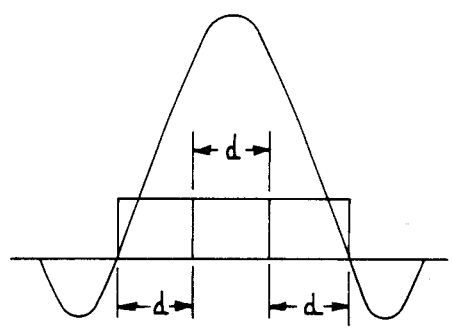
FIG. 15 is a diagrammatic illustration depicting the profile of the Laplacian of a Gaussian operator and its minimum configuration for detecting half tone dots having widths d.

FIG. 15 illustrates the minimum detectable configuration of halftone dots, where the inner dot edges are displaced by a dot width d to fuse with the dot edges at the zero crossing of the response. Setting the displacement $(w-d)/2$ equal to d yields $$w = 3d = 3(2R) = 6D/\sqrt{\pi} = 2\sqrt{2}\,\sigma, \tag{2}$$

where R is the radius of a circular dot and D is the dimension of the pixel containing the dot. (The area of the square pixel $D^2$ is equated with the area of the dot $\pi R^2$). Solving equation (2) for $\sigma$ and evaluating $\sigma$ at 150 line screen ruling ($D=1/150$ inch) yields $$\sigma = (3d/\sqrt{2\pi})(1000/.5118) \approx 16 \text{ pixels}, \tag{3}$$

where the camera operates with 13 micron pixels at 1:1 or 0.5118 mils per pixel. Since $\sigma$ varies linearly with the screen ruling, $\sigma$ can be evaluated for screen ruling other than 150 by using proportional scaling from the ubiquitous 150 line screen value:

$$\sigma_{screen} \text{ ruling}=(150/\text{screen ruling})(\sigma_{150} \text{ ruling}) \tag{4}$$

An elementary Fourier analysis can provide both a decimation factor which should be used and also a fairly precise value for $\sigma$ at 150 line screen ruling. By determining an upper limit, a value for $\sigma$ is obtained that is as large as possible in the direction away from detecting individual dot edges. A lower limit for $\sigma$ is of lesser utility in actual practice.

First, the Gaussian of the LOG exp $(-r^2/2\sigma^2)$ and its Fourier transform exp $(-\sigma^2R^2/2)$ are considered. By the Parseval Theorem, the original LOG and the transformed waveform have equal energy. A good approximation of equal energy can be obtained by equating the arguments of the two exponentials and evaluating the radius parameter r at $\sigma$. This yields the result $$\sigma = 1/R \tag{5}$$

and gives the desired relationship between the spatial frequency R and $\sigma$. Since decimation is a sampling problem, sampling theory can be applied. Applying the Whittaker-Shannon Sampling Theorem, if the sampling rate or decimation factor is $\Delta$, then the spatial frequency R must be no less than the R value at the Nyquist limit, namely, $$1/R = 2\Delta = \sigma \tag{6}$$

At and above the Nyquist frequency R, aliasing error due to the coarseness of sampling can be safely ignored.

The second equality in equation (6) is taken from equation (5). Equation (6) is the upper limit for $\sigma$ since $1/R$ can not exceed $2\Delta$. Extracting from equation (3) the 16 pixel figure for 150 line screen ruling, the value of $\Delta$ is 8. Clearly, the desired integral decimation factor is closer to 8 than to 7 or 6.

From equation (6), a rather precise value for $\sigma$ can be determined, taking into account dimensional units and the fact that the pixel size is 0.5118 mils/pixel:

$$(0.5/0.5118 \text{ mil/pixel})(\sigma \text{mil})/2 = \text{integer} = 8 \tag{7}$$

Canceling the mil units in equation (7) yields:

$$\sigma_{150 \text{ line screen ruling}} \approx 16.38 \text{ pixels}. \tag{8}$$

It has been verified by numerical experimentation that significant deviation from the nearly optimum value of $\sigma$ given by equation (8) leads to edge degradation. In practice, the 150 line $\sigma$ can be applied to smaller screen rulings down to about 120 with good results. However, the 150 line $\sigma$ cannot be applied to rulings above 150 without creating inaccuracies. In the case of screen rulings above 150, the given by equation (4) can be used with good results. This reaffirms that excess resolution is not particularly harmful but a lack of resolution is quite harmful to accuracy. It is also desirable to apply the 150 line $\sigma$ to smaller screen rulings because the 150 line $\sigma$ resolves fine non-halftone detail (register or fiducial marks, solid type line or line art) that may be mixed with halftone detail better than a calculated for the small screen ruling. However, this strategy should not be pushed too far because at some point, too many edges in the smaller screen rulings would be detected and the method would be slowed down considerably. The 150 line $\sigma$ has been empirically determined to be the optimum central value in the treatment of different rulings.

The LOG operator of equation (1) is realized by a finite, square gridded mask M having an odd size:

$$\text{mask size} = \text{NODD}(2\pi\sigma), \tag{8a}$$

where NODD is the nearest odd integer. Using the $\sigma$ defined by equation (8) gives a nominal mask size of $103 \times 103$ with 150 line halftone screen, with symmetric dimensionality about the central point. The mask is large enough to render the zero sum mask correction sufficiently small. The zero sum mask correction modifies each positive element in the original mask by a factor $1 - \text{sum/positive sum}$, where "positive sum" is the sum of positive elements in the original mask and "sum" is the original sum of all mask elements. The corrected mask has zero sum over all elements so that the mask responds with zero value to a uniform picture.

The filter mask M is invariant to rotation by 180 degrees, and each value of the decimated convolution is simply the dot product of the mask M at the desired location and the corresponding (same size as M) data block of the binary picture P:

$$M \text{ dot } P(\text{block}) \tag{9}$$

Figure 16:
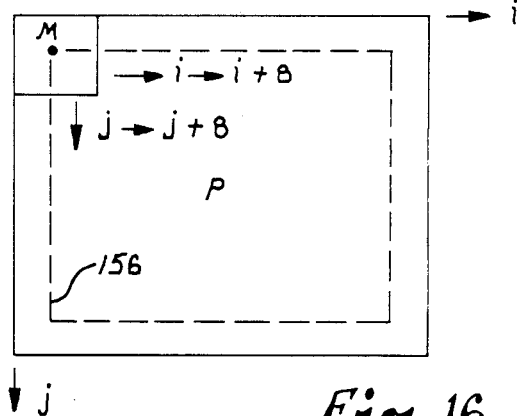
FIG. 16 is a diagrammatic illustration depicting application of a mask M to a picture P in order to generate a decimated convolution.

The dot implies the dot product as if each array M and P (block) were a vector in concatenated columns. FIG. 16 depicts how all of the decimated convolution values are generated by moving the $103 \times 103$ pixel mask M over the picture P in increments of 8 pixels along both of the mutually perpendicular i and j directions. Since a partial convolution is not allowed, only the convolution values inside of the dotted lines 156 in FIG. 16 result. Using a mask of $103 \times 103$ pixels with a picture size of 640×640 pixels provides a decimated convolution which fills an array having a size of N×N, where N=1+NEAREST INTEGER to (640−103)/8=68. Thus, the decimated convolution is an array of 68×68 pixels containing tones that vary between positive and negative values.

Zero Crossing Extraction In The Convolution Result To Determine Initial Edge Locator When using second derivative operators such as the LOG, edges are located by determining the positions where the convolution result crosses zero and changes sign. For some applications, the convolved image can be scanned horizontally in one dimension for two adjacent pixels of opposite sign or for three adjacent pixels, the middle of which is zero and the other two of which have opposite signs. However, in two dimensions, a more sophisticated approach is necessary in order to assure that the detected zero crossing contours preserve the size and shape of the regions of opposite sign they bound and also to prevent anomalies such as the creation of spurious edges. In accordance with the present invention, an algorithm known as the U.S.C. predicate is applied to each 3×3 window in the 68×68 convolution array that results from application of the LOG in the manner previously described.

The U.S.C. predicate was developed at the University of Southern California by A. Huertas and D. King and has been continually refined and improved in recent years. The U.S.C. predicate is a predicate based algorithm which provides a set of rules for recognizing a finite number of possible convolution sign and magnitude patterns that correspond to definite predictions for the location and direction of the edges at zero crossings in the convolution. Actually, the U.S.C. predicate is a set of 11 individual predicates or logic elements that each corresponds with a certain pattern of signs and relative magnitudes of the convolution response in order to identify one or more edge locations and directions.

Figure 17:
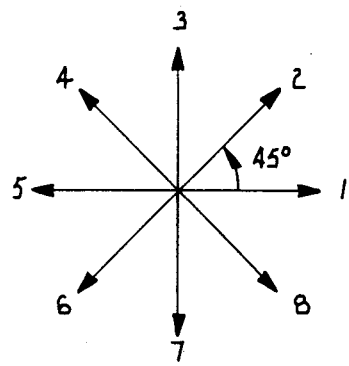
FIG. 17 is a diagrammatic illustration depicting the eight quantized directions of the edges in the U.S.C. predicate application.

The U.S.C. predicate is applied by centering a 3×3 pixel window successively at each pixel in the convolution array output. Selected algebraic signs and relative magnitudes of the convolution output values in each 3×3 window are inspected for a match to one of eleven allowable zero crossing predicates (or templates). If a 3×3 window in the filtered image matches one of the predicates, edge locations and edge directions are marked at the appropriate pixels. It should be noted that a predicate may yield more than one edge location (with direction). If there is no match in the window, no edge is located there. The eleven predicates are specifically constructed to preserve the topology of the signed regions and prevent detection of extraneous edges. Since the predicate templates explicitly model the signs of the pixel values in the 3×3 windows, they also constrain each edge orientation to one of eight quantized directions which are shown in FIG. 17 by the directional lines labeled 1–8 and which are offset from one another by 45° progressing counterclockwise.

The U.S.C. detection algorithm is known to those skilled in the art of edge detection, and its manner of application in the present invention is described specifically by the FORTRAN computer program listing which is identified as Appendix A to this application. In this listing, each call to subroutine E3PSCX initiates examination of the predicate matches for a window centered at coordinates j2, i2 in the convolution response array PSS (j,i). The nine window locations are identified by the letters a–i from top to bottom and left to right. Subroutine E3MEX marks and stores the detected edge locations and edge direction numbers (numbered as shown in FIG. 17).

Compute Full Resolution Sampled Edge Locations By Interpolation

Figure 18:
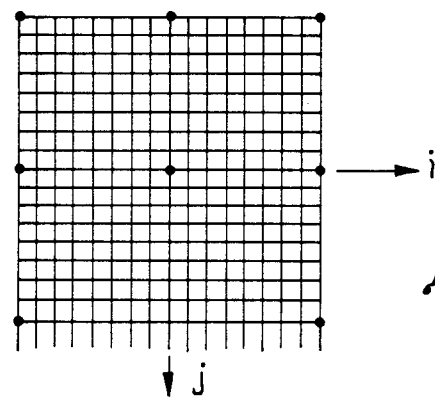
FIG. 18 is a diagrammatic illustration depicting the interpolation grid which is erected about each initial edge location in accordance with the invention.

The edges which are detected by application of the U.S.C. predicate algorithm lie on pixels of the reduced resolution (decimated) convolution. In order to determine the edge locations to the nearest full resolution pixel, it is necessary to utilize interpolation techniques. The interpolation method employed in the present invention involves erection of the interpolation grid shown in FIG. 18 about each initial edge location in the reduced resolution response data array $R_d$. The grid spacing is $\frac{1}{8}$ that between the elements in array $R_d$. There are thus 289 (17×17) potential fine grid point locations for the full resolution edge position (to the nearest grid point).

It is possible to interpolate a response for each of the 289 grid points and apply the USC predicate to find all of the full resolution edge points in the interpolation cell. However, this procedure is unduly time consuming, and a sampling approximation is thus made, namely, for each initial edge location, only one interpolated edge position is chosen. The choice of interpolated edge position is that location of the 289 locations that exhibits the minimum interpolated response magnitude. This choice has the virtue that the point chosen is indeed a zero crossing or edge position. The location of this edge position, however, has a certain unpredictability about where it will occur. In practice, this unpredictability produces no known degradation of the final registration results.

The interpolation method is a well known general formula (see Powell, "Approximation Theory and Methods", 1981, Chapter 19) which is specialized to restrict the interpolation offset from a central data point to the desired point. The center-surround data scheme evokes maximum accuracy from the method. A 9×9 interpolation data grid achieves accuracy from the bicubic spline interpolation to the level of several parts per thousand. Another technique used to further improve accuracy is the moveable interpolation data center. The accuracy of the interpolation is order $h^3$, where h represents the size of the interpolation offset (a number between 0 and 1 in distance divided by the grid spacing). If the magnitude of either of the 2-dimensional interpolation offsets dx, dy exceeds $\frac{1}{2}$, then the central data point can be shifted to a neighboring point and a corresponding new offset can be taken from the moved data center to the desired point, that is less than or equal to $\frac{1}{2}$ in magnitude. For example in one dimension, an offset of $\Delta$ of $\Delta = 0.75$ from central data point i would be replaced by a new offset (a complementary offset) of $-(1-0.75) = -0.25$ to the left of new data center $i+1$.

The specialized interpolation formula is $$R(j + dy_j, i + dx_i) = \sum_{m=-4}^{4} \sum_{n=-4}^{4} l_m(dx_i) \lambda_n(dy_j) R_d(j + n, i + m) \quad (10)$$

where R is the interpolated response, $R_d$ is the interpolation response data, and $dx_i$, $dy_j$ are the interpolation offsets ($\leq \frac{1}{2}$ in magnitude). The cardinal functions $l_m, \lambda_n$ of the interpolation are linear combinations of the cubic B splines $$B_p^3(\epsilon) = 24^{-1}[(\epsilon - \xi_p)_+^3 - 4(\epsilon - \xi_{p+1})_+^3 + \qquad (11)$$
$$6(\epsilon - \xi_{p+2})_+^3 - 4(\epsilon - \xi_{p+3})_+^3 + (\epsilon - \xi_{p+4})_+^3]$$

where $\xi_p = p = 0, +-1, +-2, \ldots$ are the knots of the piecewise polynominal, is an illustrative argument, and the truncated cubed differences in the spline formula are $$(\epsilon - \xi)_+^3 = (\epsilon - \xi)^3 \text{ for } \epsilon - \xi < 0 \qquad (12)$$

and $$(\epsilon - \xi)_+^3 = 0 \text{ for } \epsilon - \xi \leq 0. \qquad (13)$$

The cardinal functions are $$lm(dx_i) = \sum_{P=-\infty}^{\infty} C_{pm} B_p^3(dx_i) \qquad (14)$$

and $$\lambda n(dy_j) = \sum_{P=-\infty}^{\infty} C_{pn} B_p^3(dy_j) \qquad (15)$$

with weighting coefficients given by $$C_{pm} = 4\sqrt{3}\, (\sqrt{3} - 2)^{|m-2-p|} \qquad (16)$$

and $$C_{pn} = 4\sqrt{3}\, (\sqrt{3} - 2)^{|n-2-p|} \qquad (17)$$

The infinite sums in the cardinal functions have only a finite number of non-zero terms that are determined by using the fact that the B spline is zero outside of the end points between which it is defined. In actual practice, the interpolation coefficients in equation (10) are computed and stored once for each of the 289 grid points since the coefficients are the same for each edge interpolation.

Correct The Interpolated Location For Log Operator Bias

Due to the intrinsic shape of the LOG operator, the location of a zero crossing of the LOG convolution is not the true edge location except in the case of a perfect step edge. The shift in position from the zero crossing to the true edge location is the operator edge bias which must be compensated for to accurately locate the true edge position. For a perfect edge, the convolution response is a symmetrical doublet with zero crossing at the center of the response (zero edge bias). The simplest example of an edge bias is the response to a spike. The response has the same shape as the LOG itself with zero crossings displayed out to the sides of the LOG. This case is illustrated by FIG. 14a with the feature width d going to zero to approximate a spike. The LOG convolution of the spike has the same appearance as the LOG (see FIG. 13b).

Figure 19:
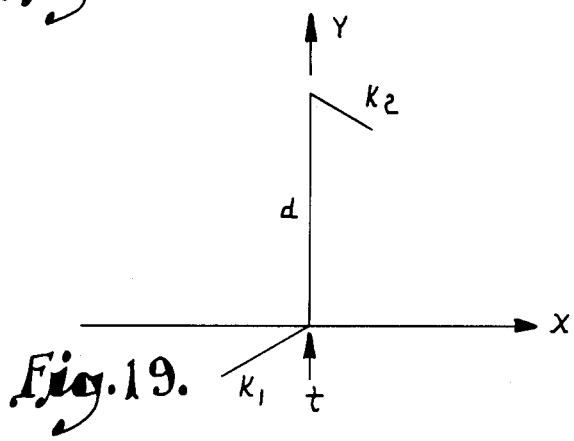
FIG. 19 is a diagrammatic illustration depicting the model edge used to correct the edge locations for operator bias.

Because the operator edge bias can vary between pictures that are to be registered, it must be corrected by computing the true edge locations rather than the zero crossings. In accordance with the present invention, a simple model edge response is used to facilitate prediction of the true edge locations. The model edge is shown in FIG. 19 and comprises a step having a height d in the y coordinate direction with a jump discontinuity $k2-k1$ in the y derivative with respect to x across the step. If $k2-k1=0$, the step is a perfect step and the edge bias is zero. Using integration by parts, the model convolution response to the model edge is $$R = yG'(x-t) - y'G(x-t)\Big|_1^2 \qquad (18)$$

where x is the observation coordinate and t is the true edge location to be found. The function $G(u) = \exp(-u^2/2\sigma^2)$ is the one dimensional Gaussian. Evaluating equation (18) across the jump discontinuity yields $$R = [-d(x-t)/\sigma^2 + \Delta k]\exp[-(x-t)^2/2\sigma^2] \qquad (19)$$

where $\Delta k = k2-k1$. By setting $R=0$ in equation (19), the relationship between $\Delta k$ and $\sigma$ can be obtained, namely $$x_z - t = \sigma^2 \Delta k/d \qquad (20)$$

where $x_z$ is the zero crossing edge location (including bias).

Forming the ratio of equation (19) at $x=x_1$ and $x=x_2$, where $x_1$ and $x_2$ are on opposite sides of $x_z$, introducing the term $\lambda = x_z - t$, and solving for $\lambda$ yields:

$$\lambda = \sigma^2 \ln|R_1(x_2 - x_z)/R_2(x_1 - x_z)| + \frac{(x_1 - x_z)^2 - (x_2 - x_z)^2}{x_2 - x_1} \qquad (21)$$

where $R_1$ and $R_2$ are interpolated responses at points 1 and 2. Thus, by computing $\lambda$ from known quantities, the true edge position is:

$$t = x_z - \lambda \qquad (22)$$

Figure 20:
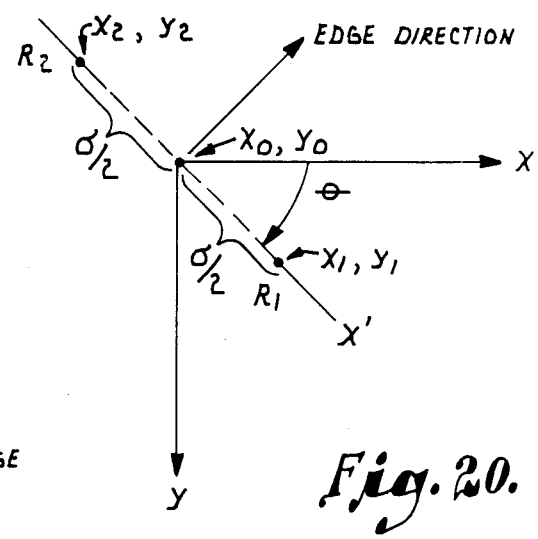
FIG. 20 is a diagrammatic illustration depicting the geometry of the edge bias correction.

In order to use the one dimensional model of equations (21) and (22), the single dimension must lie along the line connecting $x_1, y_1, x_0, y_0,$ and $x_2, y_2$, where $x_0, y_0$ is the interpolated edge location and $x_1, y_1$ lies at a distance $\sigma/2$ from $x_0, y_0$ in the direction 90° clockwise from the edge direction. Then, $x_2, y_2$ is the displacement opposite to the "1" displacement from $x_0, y_0$. In the rotated frame of the response line, $x'_z = 0$ and the prime (rotated) frame coordinates of the 1, 2 points are $$x'_1 = (x_1 - x_0)\cos\theta + (y_1 - y_0)\sin\theta \qquad (23)$$

and $$x'_2 = -x'_1 \qquad (24)$$

where the angle $\theta$ is positive clockwise in the unprime frame of x positive right and y positive down. FIG. 20 pictorally depicts this geometry. From equation (21), $\lambda$ evaluated in prime frame coordinates is given by $$\lambda = -(\sigma^2/2x'_1)\ln|R_1/R_2| \qquad (25)$$

and finally, from equation (22) and the conventional transformation equations back to the unprime coordinate frame, the true edge position is $$x_{true} = -\lambda \cos\theta + x_0 \qquad (26)$$

and $$y_{true} = -\lambda \sin \theta + y_0 \quad (27)$$

Figure 21:
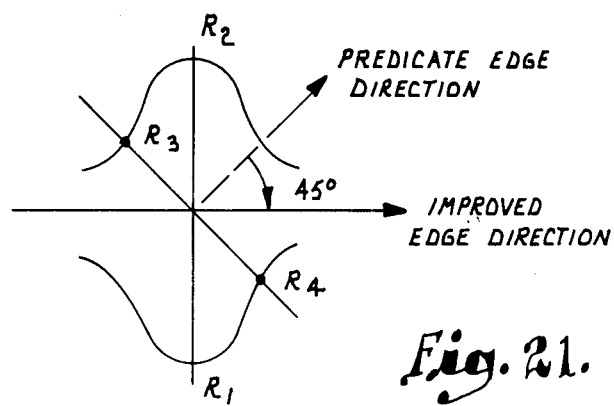
FIG. 21 is a diagrammatic illustration depicting qualitatively how a 45° shift in direction can improve the edge direction used to compute the edge bias correction.

The normal to the predicate edge direction that enters the calculation of equation (25) is varied by 45° in both directions from the nominal direction to determine whether or not an improvement results. The improvement constitutes a larger $|R_1| + |R_2|$ which is proportional to the absolute slope of the zero crossing. FIG. 21 qualitatively illustrates how a 45° shift in direction can place $R_1$ and $R_2$ "more squarely" in the dominant response region where the slope of the zero crossing is maximum. While the improved edge direction is used to compute the edge bias correction, the original edge direction is used to create line segments in a manner that will be fully described. The reason is that the original edge directions relate to the model connectively of the edges produced from the U.S.C. predicate, and this connectivity should not be altered by modifying edge directions. However, there is no reason to compute better responses from the modified edge directions since the U.S.C. predicate does not guarantee that the best responses will be perpendicular to the predicate edge directions.

The interpolated responses are screened to assure that their signs are opposite (the edge is rejected if they are not). A screening is also performed on the magnitude of $\lambda$ determined from equation (25). $\lambda$ must satisfy the equation $$|\lambda| \leq \sqrt{2\sigma} \quad . \quad (28)$$

Since $w/2 = \sqrt{2} \nu$ is the largest possible edge bias magnitude. A further screening is performed on the absolute value step height d deduced from equations (19), (20) and (25) with x' evaluated at response point 1.

$$|d| = \sigma^2 |R_1| \exp[(x'_1 + \lambda)^2/2\sigma^2]/|x'_1| \quad (29)$$

To determine the threshold of d above which an edge should be rejected, typically extreme parameter values are used to evaluate equation (29), such as $$|d| = 800\sigma \exp[[\tfrac{1}{2} + \sqrt{2}]^2/2] \approx 8 \times 10^4 \quad (30)$$

Thus, if $|d|$ exceeds a threshold of $10^5$ the edge is rejected, and this technique eliminates surious and very weak edges.

A final screening is performed on each edge. An acceptable edge must correspond to either a positive maximum or negative minimum in the first derivative response. All other edges should be eliminated. The condition for an acceptable edge is therefore $$\text{sign}(f_1)\text{sign}(f_3) < 0, \quad (31)$$

where $f_1$ is the first derivative response and $f_3$ is the third derivative response. The third derivative sign is simply obtained from the edge polarity convention, namely $$\text{sign}(f_3) = -(\text{sign of response 1 in the edge bias computation}). \quad (32)$$

The first derivative sign requires that the decimated convolution of the picture data with the Gaussian factor of the LOG be computed. This convolution is precisely analogous to the decimated LOG convolution previously described. The first derivative is the directional derivative in the direction of the clockwise normal to the edge direction, namely $$f_1 = -f_x \sin \theta + f_y \cos \theta \quad (33)$$

where $\theta$ is the edge direction angle. To compute the x and y direction derivatives, the location of each edge in the Gaussian convolution is determined and a Lagrange polynomial interpolation is performed for each derivative based on the data points shown in FIG. 22. With p signifying either x or y direction data and $\xi$ signifying either x or y, the derivatives $f_x$ and $f_y$ can be computed from the interpolation formula $$p(\xi) = \xi^3 \left[ \frac{p_0}{6} - \frac{2}{3} p_1 + p_2 - \frac{2}{3} p_3 + \frac{p_4}{6} \right] + \quad (34)$$

$$\xi^2 \left[ -\frac{p_0}{4} + \frac{p_1}{2} - \frac{p_3}{2} + \frac{p_4}{4} \right] +$$

$$\xi \left[ -\frac{p_0}{12} + \frac{4}{3} p_1 - \frac{5}{2} p_2 + \frac{4}{3} p_3 - \frac{p_4}{12} \right] +$$

$$\left[ \frac{p_0}{12} - \frac{2}{3} p_1 + \frac{2}{3} p_3 - \frac{p_4}{12} \right]$$

In equation (34) $\xi$ is the fractional distance (unit spacing) to the desired derivative evaluation point in the Gaussian convolution. Thus, equation (31) can be computed from equations (32)-(34) to perform the final screening on each edge.

Produce Linear Segments From The Final Edges

Linear segments are produced from the edges that result from the foregoing procedure, and the segments are then fit to the true edge positions. The steps involved in segment production include the conventional steps of linking the edges and tracing the linked edges in the manner described in Nevatia and Babu, "Linear Feature Extraction and Description", Computer Graphics and Image Processing, no. 13, pp. 257-269 (1980). The step of linking edges involves using the connectivity and edge directions of the initial edges (reduced resolution edges) to determine the precursors and successors of each edge in connection to its neighbor edges. In the tracing of linked edges, all distinct chains of connected edges are produced by tracing along the linked edge data (each edge points to certain of its neighbors). The allowed angle transition in linking is 45°, rather than the 30° stated in the above referenced paper.

The segments are fit to the positions of the edges in the distinct chains that result from tracing. A fitting tolerance of 0.75 pixel is employed (no edge represented by the segment deviates in perpendicular distance to the segment line by a distance greater than this 0.75 pixel fitting tolerance). The fitting technique involves first creating 2-segments (segments connecting two neighboring edges) and then combining the 2-segments into longer segments by adding other 2-segments until the fitting tolerance is exceeded. The last "successful" 2- segment forms the terminus of the longer segment, and a new segment begins with the failed 2-segment.

The result of the segment fitting is a list of segment endpoint coordinates for each segment in both of the reference and moved pictures. Before these data are used, they are transformed to segment center, segment length and segment angle data. The segment angle is determined with respect to a coordinate system in which the x coordinate is positive to the right and the y coordinate is positive down. The segment angle is positive in a clockwise direction from the x axis and lies between 0 and $\pi$ radians.

Segment Registration

Segment registration is next carried out to predict the final registration offset. Segment registration proceeds in two stages, namely, initial segment registration accomplished by the parameter space method and final registration utilizing least squares techniques. The result of the final registration provides the offsets between the two pictures to be registered and, following the vector alignment step, causes the chase to be properly positioned for punching of the moved picture in the locations necessary for registration with the reference picture.

Initial registration takes advantage of the robust nature of the parameter space method (PSM) and the fact that it does not require all segments in one picture to exactly correspond with the segments in the other picture. The PSM matches similar but not necessary identical pictures and it allows matching of segments having different lengths and slightly different angular orientations. Each picture has a list of segments each characterized by length, angle and center coordinates. The parameter space in the PSM is an accumulator array in the coordinates of the desired offset. For each matching pair of segments (one from each list), the difference between segment centers defines the central offset parameter in parameter space about which a rectangular painting window is erected.

As shown in FIG. 23, the parameter space in the PSM is the accumulator array P in the coordinates of the initial picture registration offset (the offset by which the moved picture can be moved into initial registration with the reference picture). The grid spacing in P is not illustrated in FIG. 23 but is one pixel of the original digital pictures for which segments were produced. A typical size for P is 240×240 pixels, which allows the pictures to be misregistered by slightly more than ±5 rows of 150 line screen halftone dots.

Each pair of segments (one from each picture) is tested to determine if the segments match closely enough in angle. If they do, the pixels in P within a rectangular window centered at the parameter of the distance between segment centers accumulate a "score" (P→P+score) for that pair. Once all segment pairs have contributed, the parameter space has a peak at a location referred to as the initial offset prediction. FIG. 24 shows qualitatively how the segment pair "score painting" windows overlap to produce a peak at coordinate position $x_{off}, y_{off}$. The peaks in P tend to be rather rough or "spiked", as shown in FIG. 25a. Hence, the P score space is smoothed with a Gaussian smoothing convolution before the peak is located. After smoothing, the profile is typically as shown in FIG. 25b and has a smoother peak 156.

Considered in more detail, the PSM can be applied to an exemplary pair of segments that may possibly contribute to P. The two segments have lengths $l_1$ and $l_2$, angles $\theta_1$, and $\theta_2$ and center coordinates $x_{1c}$, $y_{1c}$ and $x_{2c}$, $y_{2c}$. The subscript identifies the segment of the reference picture and subscript 2 identifies the segment of the moved picture.

The first test applied to the segment pair is the condition $$\min = \text{Minimum } (l_1, l_2) \geq l_{tol} \tag{35}$$

where $l_{tol} = 8$; otherwise the segment pair does not contribute. $l_{tol}$ can be regarded as an information content parameter. The value 8 represents the typical distance between two sampled edges from which the segments were constructed. Such a distance is clearly a physically reasonable minimum acceptable amount of information for any segment.

The second and final test applied to the segment pair is the angle acceptance threshold test. The segment pair is accepted if the segment absolute angle difference is less than or equal to a threshold:

$$|\theta_1 - \theta_2| \leq threshold = Arctan[c/l_1] + Arctan[c/l_2] \tag{36}$$

The parameter c is a pixel displacement at each segment end and has been empirically determined to be adequate at c=2.2. Both segments must pass the physically reasonable condition (36), which is more restrictive than a simple constant threshold.

Because the convention is reference=moved plus offset, the offset to the center of the rectangular score painting window for the segment pair is given by the following difference between the segment centers:

$$x_i = \text{Nint}(x_c - x_{2c}) \tag{37}$$

and $$y_j = \text{Nint}(y_c = y_{2c}) \tag{38}$$

where Nint signifies to the nearest integer. The rectangular score painting window centered at the coordinates given by equation (37) and (38) in P is a rectangle of length L given by $$L = l_1 + l_2 \tag{39}$$

and of constant width W given by $$W = 3. \tag{40}$$

The angle $\theta$ of the window is the angle of the long axis through the window center. $\theta$ should be closer to the angle of the longest segment, hence $\theta$ is taken as a segment length weighted angle $$\theta = (l_1\theta_1 + l_2\theta_2)/(l_1 + l_2) \tag{41}$$

A special case can occur when one of the segment angles is near pi and the other angle is near zero. In this case, the angle near pi is converted to a small negative angle by subtracting pi prior to using equation (41). Actually, this special case conversion is accomplished before testing the angle difference in equation (36) to avoid rejection of valid (special case) matches.

For each grid point of the accumulator P that lies inside the window, P at that grid point is accumulated by adding the score multiplied by a trapezoidal score profile factor that is the overlap factor between segments. This segment overlap factor is zero at the rectangle ends and ramps up linearly to 1 over a distance $l_{min}$ in from, both rectangle ends. The profile factor is thus the constant 1 only over a central region of the rectangular window of length $MAX(l_1, l_2) - l_{min}$. The total window length is thus $l_{max} - l_{min} + 2l_{min}$ or $l_{min} + l_{max} = l_1 + l_2$ as in equation (39). An empirically determined score that has been found to yield good quality registrations is the following:

$$\text{score} = (1 + l_{min}/l_{max})^2 \qquad (42)$$

where $l_{max}$ is the maximum of $l_1$ and $l_2$. The rationale behind the score given by equation (42) is that 1 represents a purely democratic score without bias and the factor $l_{min}/l_{max}$ biases the base score of 1 in favor of segments that are more closely similar in length (the length ratio, however, is not biased toward either longer or shorter segment pairs). Finally, the squaring of the score improves the signal to noise ratio in the score or accumulator space.

The result when all segment pairs have contributed is ready for smoothing. The smoothing is accomplished by a convolution in which the center of a $7 \times 7$ mask S is passed over the accumulator P in steps of one pixel in both directions. The result of the convolution is S dot WINDOW DATA where WINDOW DATA is the corresponding $7 \times 7$ array of P data. The accumulator location at which the peak of the smoothing convolution occurs is the initial offset that moves the moved picture into initial registration with the reference picture. The mask S is simply a Gaussian $\exp[(-x^2 + y^2)/2\sigma_0^2]$ evaluated at the discrete $x_i, y_j$ location of the mask. A value of the smoothing sigma that yields very good results is $$\sigma_0 = \text{smoothing sigma} = 1.5. \qquad (43)$$

The purpose of the final least squares registration stage is to correct the initial segment registration by a small amount (a few mils or less) to compensate for possible size differences between the two pictures (not necessarily uniform size differences or magnification differences). When size differences are not present, the least squares correction is small enough to ignore, although it even then may represent an improvement over the initial segment registration.

Compensation for size differences may be termed "splitting the difference". For example, FIG. 26a shows a "blob" of detail 158 in one color along with a similarly shaped "blob" 160 in another color which is smaller than blob 158. The blobs 158 and 160 are incorrectly registered with one contour of the smaller blob 160 coinciding with a corresponding contour of the larger blob 158. In contrast, FIG. 16b depicts similarly shape but different sized blobs 162 and 164 properly registered with the smaller blob 164 centered within the larger blob 162. In the correct registration, the misalignments between the corresponding contours of the two blobs of detail are split, thus centering the smaller blob within the larger blob after the differences have been split.

Figure 27:
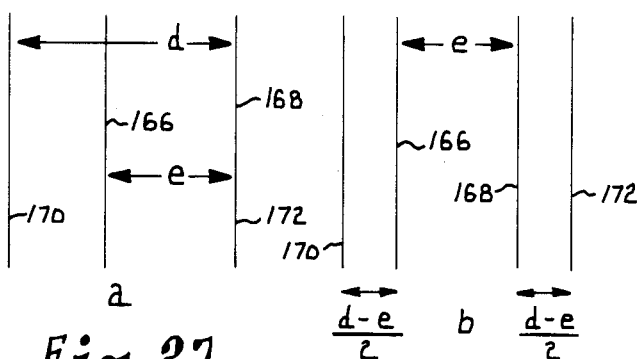
FIG. 27a is a diagrammatic illustration depicting a pair of line segments initially registered.
FIG. 27b is a diagrammatic illustration depicting the line segments of FIG. 27a following least squares final registration.

A simple example is illustrative of how difference splitting results from application of the least squares concept. In FIG. 27a, one pair of segments 166 and 168 separated by a distance e are initially (but incorrectly) registered with another pair of segments 170 and 172 separated by a greater distance d. In the initially registered position, segments 168 and 172 are aligned but the other segments 166 and 170 are considerably misaligned due to the difference between the distances d and e. If o represents the offset required to accomplish difference splitting, the least squares measure for minimizing the sum of intersegment distances is given by the expression $$M = (d + e + 2o)^2 \qquad (44)$$

Taking the partial derivative $\alpha M/\alpha o$ and setting it equal to zero yields $o = -(d+e)/2$. Adding o to d splits the difference because $d + o = (d-e)/2$, and the segments are properly registered as shown in FIG. 27b when the difference is split with the corresponding segments 166 and 170 separated by $|o| = (d-e)/2$ and segments 168 and 172 separated by the same distance.

Although this simple example may be generalized, the use of tensor analysis allows for averaging of the distance between segments and for the inclusion of the best fit rotation correction between pictures as well as the best fit translational offset correction. This formalism leads naturally to the classic, solved problem of minimizing a quadratic form.

L is a straight line represented by column vector (a b c)$^t$ (t denotes transpose), where the line equation is $$aX + bY + c = 0 \qquad (45)$$

subject to the normalization condition $$a^2 + b^2 = 1 \qquad (46)$$

The distance from a point $P = (X\ Y\ 1)^t$ to the line L is the dot product $$d(P, L) = L^t \cdot P \qquad (47)$$

Under the assumption of rigid body and small motion (first order approximation in which rotation angle $\omega$ satisfies the condition $\sin(\omega) \approx \omega$), the displacement of a point P into a point Q due to translation T and rotation $\Omega$ becomes T and a vector cross product added to P, namely $$Q = P + T + \Omega \times P \qquad (48)$$

In homogeneous coordinates, the linear operation of equation (48) can be expressed in matrix form:

$$Q = \begin{pmatrix} x + t_x - \omega Y \\ y + t_y + \omega X \end{pmatrix} = \left\{ \begin{array}{l} (XY1) \begin{pmatrix} 0001 \\ 0010 \\ 1000 \end{pmatrix} \begin{pmatrix} t_x \\ t_y \\ \omega \\ 1 \end{pmatrix} \\ (XY1) \begin{pmatrix} 0010 \\ 0001 \\ 0100 \end{pmatrix} \begin{pmatrix} t_x \\ t_y \\ \omega \\ 1 \end{pmatrix} \\ (XY1) \begin{pmatrix} 0000 \\ 0000 \\ 0001 \end{pmatrix} \begin{pmatrix} t_x \\ t_y \\ \omega \\ 1 \end{pmatrix} \end{array} \right\} \qquad (49)$$

In tensor notation, the matrix (49) can be written as (summation over repeated indices implied):

$$Q_i = \Delta_{ijk} D_j P_k \qquad (50)$$

Since any point P is displaced to Q, the distance from a reference segment $S_R$ to a straight line $L_M$ representing the moved segment $S_M$ is, from equations (50) and (47), $$d(P, L_M) = \Delta_{ijk} NR_i D_j P_k \tag{51}$$

Rigid motion requires that D in equation (51) be constant. The squared distance from equation (51) can be integrated along the points of segment $S_M$:

$$d^2(S_M, S_R) = \int_{sm} (\Delta_{ijk} NR_i D_j P_k)^2 \, ds \tag{52}$$

On performing the integral of equation (52) the result is the scalar $S_K$ for the Kth segment pair:

$$S_k = D^t(NN)^t(PP)(NN)D \tag{53}$$

In formula (53), the D is the displacement $$D = \begin{pmatrix} tx \\ ty \\ \omega \\ 1 \end{pmatrix} \tag{54}$$

The matrix NN is the tensor dot product $$(NN)_{jk} = \Delta_{ijk} NR_i \tag{55}$$

where the vector NR is $$NR = (abc)^t \tag{56}$$

Explicitly, NN is $$NN = \begin{pmatrix} 0 & 0 & b & a \\ 0 & 0 & a & b \\ a & b & 0 & c \end{pmatrix} \tag{57}$$

Given that $S_M$ goes from endpoint vector $A_1$ to vector $A_2$ with length $l_M$, the matrix PP is $$PP = (l_M/6)[A_1 A_1^t + A_2 A_2^t + (A_1 + A_2)(A_1 + A_2)^t] \tag{58}$$

where the vectors are $$A_1 = \begin{pmatrix} x_1 > m + x_{OFF} \\ y_{1m} + y_{OFF} \end{pmatrix} \text{ and } A_2 = \begin{pmatrix} x_{2m} + x_{OFF} \\ y_{2m} + y_{OFF} \end{pmatrix} \tag{59}$$

In expressions (59), the initial registration move $x_{off}$, $y_{off}$ from the initial segment registration has been added to the endpoint coordinates of the moved segment (which has been moved into initial registration with the reference segment so that displacement D of expression (54) will represent a correction to the initial move). The other segment data are the a,b c parameters evaluated from the reference segment endpoint data, or $$a = (y_{2r} - y_{1r})/l_R$$

$$b = (h_{1r} - h_{2r})/l_R$$

$$c = y_{1r} h_{2r}/l_R - h_{1r} y_{2r}/l_R \tag{60}$$

where $l_R$ is the length of the reference segment.

The problem now is to minimize the sum over k=1 to N of $S_k$ from expression (53) where N is the number of segment pairs entering the solution. The minimization of the quadratic form is expressed by the condition $$\sum_{k=1}^{N} [(NN)^t (PP) (NN)] D = 0 \tag{61}$$

Since D cannot vanish for a non-trivial solution, the vanishing of the summation of expression (61) implies the solution of an inhomogeneous set of 3 simultaneous equations in the variables $t_x$, $t_y$ and $\omega$. Thus, the final registration move in pixels can be written as $$X_{move} = X_{off} + t_x - \omega X_o \tag{62}$$

$$Y_{move} = Y_{off} + t_y + \omega X_o \tag{63}$$

where from expression (49), the rotation term is added back into equations (62) and (63) and evaluated at a rotation center $x_0$, $y_0$ that can be taken at the center of the pictures. Thus for 640×640 pixel original pixels, $x_0$, $y_0 = 319.5$, 319.5. This rotation term is quite important to include when $\omega$ is nonnegligible.

The choice of N in expression (61) requires care. Basically, segments that are "close" together are being registered. In deciding what segment pairs to include in expression (61), an accurate measure of closeness is the perpendicular distance from the center of the moved segment $x_{2c}$, $y_{2c}$ to the infinite line representing the reference segment. This distance $d_s$ comes from equations (47) and (60), namely $$d_s = \text{Absolute} [a(x_{2c} + X_{off}) + b(y_{2c} + y_{off}) + c] \tag{64}$$

In a two-pass screening procedure, all of the segment pairs entering the initial PSM registration are first subjected to the threshold condition $$\text{accepted for group } 1: d_s \leq t_1 = 1.5_{pixels} \tag{65}$$

In the second pass, the acceptance condition is $$\text{accepted for group } 2: t_1 < d_s < t_2 = 10; \tag{66}$$

neither segment lies in group 1. The segment pairs passing both conditions (65) and (66) enter the summation in expression (61). The first threshold given by condition (65) provides very close matches. Such segments should not be contaminated by additional spurious matches in group 2; hence the final condition (66). The threshold 10 in condition (66) is selected as a reasonable largest size difference to allow.

Finally, an efficient way to compute the summation (61) is to represent each term in PP of equation (58) by $g g^t$ where g is $$g = \begin{pmatrix} g_1 \\ g_2 \\ n \end{pmatrix} \tag{67}$$

and n is for the first two terms in equation (58) and 2 for the last term. Thus, from expressions (57) and (67), $NN^t g g^t NN$ yields the 4×4 matrix $$\begin{pmatrix} n^2a_2 & n^2ab & nabg_1 - a^2g_2n & na^2g_1 + abg_2n + acn^2 \\ n^2ab & n^2b^2 & nb^2g_1 - abg_2n & nabg_1 + b^2g_2n + bcn^2 \\ -a^2g_2n & nb^2g_1 - abg_2n & b^2g_1^2 - 2\,abg_1g_2 + a^2g_2^2 & abg^2 - a^2g_1g_3 + b^2g_1g_2 - abg_2 + cbg_1n - acg_2n \end{pmatrix} = \begin{pmatrix} V_1 \\ V_2 \\ V_3 \end{pmatrix} \quad (68)$$

$$\frac{1}{V_1^t} \quad \frac{1}{V_2^t} \quad \frac{1}{V_3^t} \quad \text{unused element}$$

The upper left 3×3 corner of the matrix (68) is $Q_3$ and $V$, $V^t$ can also be identified, so that the simultaneous equations to be solved from summation (61) become $$(\Sigma\, Q_3)\begin{pmatrix} tx \\ ty \\ \omega \end{pmatrix} = -\Sigma\, V \quad (69)$$

Where the summations range over segment pairs $k=1$, N and all $g_1$, $g_2$ and n for each kth segment pair. Equations (69) can be solved by Cramer's rule.

The result of equations (62) and (63) provides the movement required of the moved picture in order to register it with the reference picture. With the total offset of equations (62) and (63) determined for both of the selected picture points, the registration vector alignment step can be performed and the table movements required to punch holes can be computed. The machine 10 and its central system effect proper movement of the chase 52 necessary to punch holes in the carrier sheet of the moved picture at the locations which assure registration between it and the reference picture. The other two moved pictures are thereafter handled in the same manner and registered with one another and the reference picture.

It is important to realize that the offset between corresponding registration marks or other marks can be determined, as well as the offset between corresponding edges in the halftone detail.

Faster Convolutions

Two-dimensional convolutions have been described herein as array dot product computations. Such a method of computation is accurate and simple but suffers from a computational time burden. The two-dimensional convolutions described herein can all be performed by a faster, separable method that entails essentially no loss in accuracy. The computation time for separable convolutions scales as N (filter size) rather than N squared.

Figure 28:
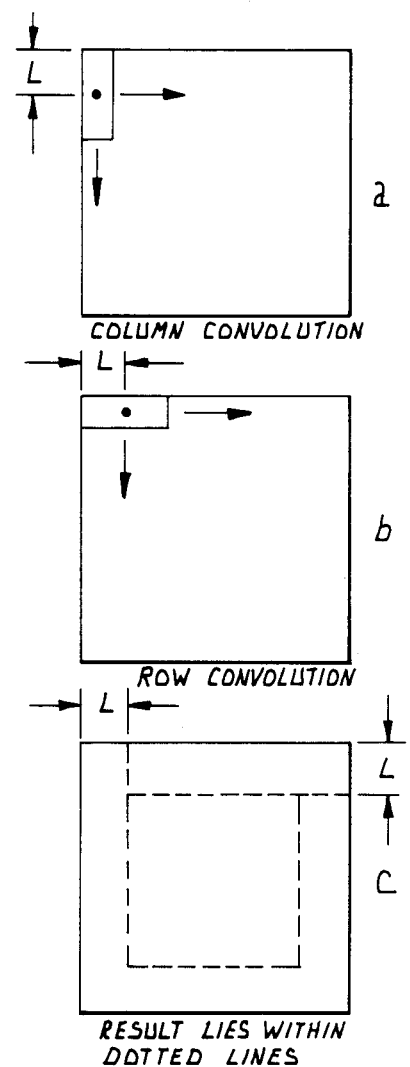
FIGS. 28a, b and c are diagrammatic illustrations depicting separable convolution processes involving application of row and column filters separately to an array of data.

The Gaussian filter is separable into $h(x)\,h(y)$ where $h(\xi)$ is the Gaussian $\exp(-\xi^2/2\sigma^2_o)$ h then becomes a common row and column filter of length 7 (discretized). FIG. 28 illustrates the separable convolution process. First, the column filter is passed over the data. The row filter is then passed over the convolution output of the column filter to yield the final result.

The LOG convolution involves a sum of separable convolutions, as first shown by Capt. David King while a student at U.S.C.:

$$\text{separable LOG filter} = h_1(x)h_2(y) + h_2(x)h_1(y) \quad (70)$$

where the two different filter functions are $$h_1(\xi) = \sqrt{.5}\, \exp\left[\frac{-\xi^2}{2\,\sigma^2}\right]$$

$$h_2(\xi) = \sqrt{.5}\, \exp\left[\frac{-\xi^2}{2\,\sigma^2}\right]\left(1 - \frac{\xi^2}{\sigma^n}\right) \quad (71)$$

Filter $h_2$ is adjusted to zero sum in a manner precisely analogous to the procedure previously described for the two-dimensional LOG filter. For each separable convolution of expression (71), the decimation is accomplished by decimating in the vertical direction only in the column filtration of FIG. 28 and in both directions in the final row filtration of FIG. 28. The linear filters for the LOG separation have the same size as the two-dimensional LOG of expression (71), namely a nominal length of 103 for 150 line screen $\sigma$.

The additional Gaussian convolution required for the first derivative sign in expression (31) can be obtained as a byproduct of the LOG convolution by taking the Gaussian filter as $h_1$ of expression (71) and using the column filtration with filter $h_1$ also as the first convolution of the Gaussian convolution. Only one extra, double-decimated row convolution is then required to produce the Gaussian convolution.

The Final Registration Vector Alignment Algorithm

The result of the edge based registration algorithm described herein is a pair of registration offsets for the two picture locations 1 and 2. Using this data, a registration transformation (translation and rotation) can be computed and applied to the reference punch hole locations, thereby predicting the new punch hole locations for the non-reference film, required to place the non-reference film into register with the reference film. The move from reference punch hole location to new location is a pure translation that is carried out separately by the chase 52 for each of the two punch holes in the reference picture carrier sheet. In the fixed reference frame of the reference punch hole locations, the punch does not actually move to the new location in that same frame; rather with a fixed punch, the table carries out a translation that is the exact opposite (by the principal of relative motion) of the motion that would be carried out by a moving punch. More precisely, the table motion is a motion into registration, and the motion of a moving punch is exactly the opposite motion.

One version of the above-mentioned registration transformation has been described in U.S. Pat. No. 4,641,244 which issued on Feb. 3, 1987 to Wilson, et al. The registration vector alignment algorithm which will now be described is preferred because it leads directly to four improvements, namely (1) the delta d-abort condition which does not punch film if the registration error is too high, (2) the split the difference registration vector alignment which reduces error, (3) the elimination of some data error by the imposition of a constant vector length constraint, and (4) the split the difference registration of films with image stretching in one film of a registration film pair.

Figure 29:
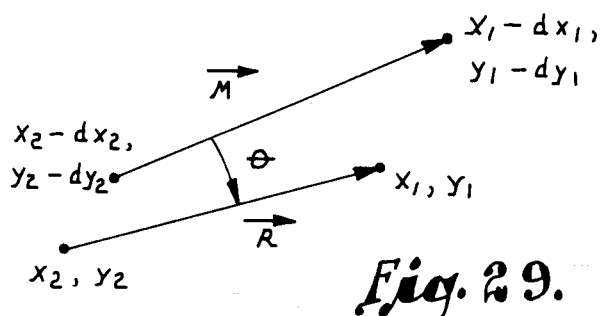
FIG. 29 is a diagrammatic illustration of registration vectors M and R prior to alignment.

The two registration picture points in each film form a vector. The reference vector $\vec{R}$ extends from point $x_2$, $y_2$ to point $x_1$, $y_1$ on the reference film. The moved vector $\vec{M}$ on the film to be registered to the reference film extends from point $x_2-dx_2, y_2-dy_2$ to point $x_1-dx_1, y_1-dy_1$, where $dx_1, dy_1$ is the computed registration offset that carries point 1M into point 1R and dx$_2$, dy$_2$ is the computed registration offset that carries point 2M into point 2R. The two vectors in a typical orientation prior to registration are shown in FIG. 29. The registration transformation first aligns the tails of the $\vec{M}$ and $\vec{R}$ vectors, then rotates vector $\vec{M}$ into alignment or registration with vector $\vec{R}$, through the angle $\theta$ in FIG. 29. With vectors $\vec{M}$ and $\vec{R}$ suitably aligned, the reference film is in register with the non-reference film containing vector $\vec{M}$.

Abort Condition From Delta-d

With no offset data error and no image stretching (global size differences between films to be registered), the lengths of vectors $\vec{R}$ and $\vec{M}$ are the same. With data error or global image size differences, the lengths differ and delta-d (the absolute difference of the lengths) can detect an abort (don't punch film) condition if delta-d exceeds some preset tolerance which is typically 3 mils. Thus, the registration error (roughly delta-d/2 in magnitude) can become intolerable in certain instances, and the machine operator is alerted by the abort and can take the appropriate action, such as rejecting the film or trying the registration again with different picture point selections or with a split the difference option which will subsequently be described.

It is useful in the following to introduce the variables $$\Delta x_0 = x_1 - x_2$$

$$\Delta y_0 = y_1 - y_2$$

$$\Delta x = dx_2 - dx_1$$

$$\Delta y = dy_2 - dy_1. \quad (72)$$

The lengths of the $\vec{R}$ and $\vec{M}$ vectors are $$d_R = \sqrt{\Delta x_0^2 + \Delta y_0^2}$$

$$d_M = \sqrt{(\Delta x_0 + \Delta x)^2 + (\Delta y_0 + \Delta y)^2} \quad (73)$$

then delta-d is $$\Delta d = |d_M - d_R|. \quad (74)$$

The abort condition is no film punching if $$\text{abort}: \Delta d \geq \Delta d_{max}, \quad (75)$$

where $\Delta d_{max}$ is the largest tolerable $\Delta d$. If there is no abort, the film is punched and the errors are acceptably small. Typically, $\Delta d_{max} = 3$ mil.

Removal of Data Error From $\Delta x$ or $\Delta y$

In the normal situation, without global image size differences, $\Delta x$ and $\Delta y$ are subject to a small data error due to normal computational error of the offsets around about 1 or 2 (0.5 mil) pixels. Since $\Delta x$ and $\Delta y$ enter the $\theta$ computation, $\theta$ can be improved by eliminating data error in either $\Delta x$ or $\Delta y$ (but not both) by the imposition of the constraint that $\Delta d$ be forced to zero for the purpose of improving either $\Delta x$ or $\Delta y$.

If the absolute angle of vector $\vec{R}$ with the horizontal is less than or equal to 45 degrees, $\Delta y$ can be taken from data and $\Delta x$ improved. For angles greater than 45 degrees, $\Delta x$ can be taken from data and $\Delta y$ improved.

The distance preserving equation is $$d_R = d_M, \quad (76)$$

and for case 1 (angle $\leq 45$ degrees, $\Delta y$ from data), $d_R = d_M$ yields from expressions (73):

$$\Delta x^2 + b\Delta x + c = 0 \quad (77)$$

where b and c are $$b = 2\Delta x_0$$

$$c = 2\Delta y \Delta y_0 + \Delta y^2, \quad (78)$$

Solving for $\Delta x$ and algebraically manipulating the solution into a computationally robust form, the improved x is $$\Delta x = \frac{-\text{sign}(b)2C}{|b| + \sqrt{b^2 - 4C}}. \quad (79)$$

For case 2 ($|\text{angle}| > 45$ degrees), $\Delta x$ from data), the $d_R = d_M$ equation in $\Delta y$ is $$\Delta y^2 + b\Delta y + c = 0 \quad (80)$$

where b and c are $$b = 2\Delta y_0$$

$$c = 2\Delta x \Delta x_0 + \Delta x^2 \quad (81)$$

The analogous solution for improved y is $$\Delta y = \frac{-\text{sign}(b)2C}{|b| + \sqrt{b^2 - 4C}} \quad (82)$$

Computation of Angle Theta

The quickest way to obtain $\theta$ is via the definition of the vector cross product of $\vec{M}$ with $\vec{R}$, solved for $\sin\theta$, which results in $$\sin\theta = \frac{[\vec{M} \times \vec{R}] \cdot [-\hat{z}]}{d_M d_R} \quad (83)$$

By the right hand screw rule, the desired negative angle cross product points in the $-\hat{z}$ direction. When improved $\Delta x$ or $\Delta y$ is utilized, the denominator of the last equation is replaced by the equal distance denominator $d_R^2$. The result is $$\sin\theta = \frac{-[(\Delta x_0 + \Delta x)\Delta y_0 - (\Delta y_0 + \Delta y)\Delta x_0)]}{d_R^2} = \quad (84)$$

$$\cdot \frac{-(\Delta x \Delta y_0 - \Delta y \Delta x_0)}{d_R^2}$$

$$\theta = \sin^{-1}(\sin\theta).$$

Computation of New Registration Punch Hole Locations

The transformation equations from the prime (rotated frame) to the unprime frame of the punch holes are:

$$x = x'\cos\theta - y'\sin\theta + h$$

$$y = y'\cos\theta + x'\sin\theta + k. \tag{85}$$

Since a translation lines up the tails of the vectors at point R, point 2R becomes the rotation origin and therefore h and k must be $$h = x_2$$
$$k = y_2 \tag{86}$$

Figure 30:
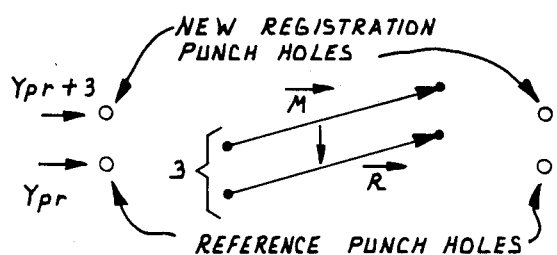
FIG. 30 is a diagrammatic illustration of a simplified example of an offset in the alignment of the registration vectors M and R.

Vector $\vec{M}$ rotates into vector $\vec{R}$ by angle $\theta$, and signed $\theta$ points to the prime or R frame. The prime frame coordinates of the punch hole locations are $$x'_p = x_{pr} - h - dx_2$$
$$y'_p = y_{pr} - k - dy_2, \tag{87}$$

where $x_{pr}$, $y_{pr}$ is a reference punch hole location and $dx_2$, $dy_2$ are subtracted for the same reason that the tail of $\vec{M}$ lies at $x_2 - dx_2$, $y_2 - dy_2$. Thus, the new registration punch holes lie at $$x_p = (x_{pr} - h - dx_2)\cos\theta - (y_{pr} - k - dy_2)\sin\theta + h$$
$$y_p = (y_{pr} - k - dy_2)\cos\theta + (x_{pr} - h - dx_2)\sin\theta + k. \tag{88}$$

evaluated for each of the two $x_{pr}$, $y_{pr}$ punch hole locations. FIG. 30 illustrates a simplified registration with $\theta = 0$, $dx_1 = dx_2 = 0$ and $dy_1 = dy_2 = -3$. Note that $y_p - y_{pr} - (-3) = y_{pr} + 3$, and that translating the new punch holes in the M film down to coincide with the reference punch holes brings $\vec{M}$ and $\vec{R}$ into registration.

Split The Difference Error Reduction

Figure 31:
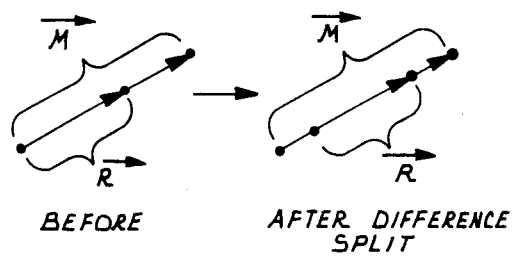
FIG. 31 is a diagrammatic illustration which depicts difference splitting in the registration vector alignment.

In the normal case of a registration not aborted by d, there is a gap at the tips of vectors $\vec{M}$ and $\vec{R}$ (aligned at the tails) of length $\Delta d$. It is an improvement to equally distribute this error at both ends of the vectors. This is again a "split the difference" correction, since the shorter length vector will be centered within the longer length vector, as illustrated by FIG. 31. Let vector $R_{12}$ extend from point 1 to point 2 on the reference film:

$$R_{12} = (x_2 - x_1)\hat{x} + (y_2 - y_1)\hat{y}. \tag{89}$$

The chase move or move of vector $\vec{M}$ with respect to $\vec{R}$ that accomplishes the desired difference splitting is simply a pure translation, namely $$\Delta x_s = \left(\frac{d_M - d_R}{2}\right)\hat{R}_{12} \cdot \hat{x} \tag{90}$$

$$\Delta y_s = \left(\frac{d_M - d_R}{2}\right)\hat{R}_{12} \cdot \hat{y}$$

where the unit vector dot products are simply $$\hat{R}_{12} \cdot \hat{x} = \frac{x_2 - x_1}{d_R} \tag{91}$$

$$\hat{R}_{12} \cdot \hat{y} = \frac{y_2 - y_1}{d_R}.$$

Since $\Delta K_s$, $\Delta y_s$ is a chase move, the negative of $\Delta x_s$, $\Delta y_s$ (a punch move) must be added to the new punch locations $x_p$, $y_p$ to offset difference splitting:

$$x_p \rightarrow x_p - \Delta x_s$$
$$y_p \rightarrow y_p - \Delta y_s. \tag{92}$$

Two Options For Retry Registrations With Global Size Difference Errors Split If a registration aborts due to $\Delta d$ induced by global image stretching size differences, the machine operator can enable one of two options for re-trying the registration with resulting errors treated by difference splitting. In such cases, the operator may accept the retried registration with larger than normal errors split, providing that the split errors are not deemed unsuitable, calling for rejection of the film. The deduced image stretching magnitude, displayed for the operator, also aids the quality control process. For retries with global image stretching in one of the two films to be registered, the $\Delta d$ abort is disabled, since $\Delta d$ would naturally be larger than normally acceptable in the presence of significant global image stretching.

Retrying option 1 model for registration with global image stretching invokes the assumption that the image stretching is uniform in both the x and y axes, precisely analogous to a uniform magnification or demagnification of one film with respect to the other film. Since uniform magnification does not change angles, the solution is simply to compute $\Delta x_s$, $\Delta y_s$ as before from expressions (90). It is necessary, however, to bypass the improvement of expressions (79) or (82) and compute both $\Delta x$ and $\Delta y$ from data [expression [72]] since the assumption of $\Delta d$ forced to zero in angle improvement with $\Delta x$ and $\Delta y$ input significantly modified by global size differences is invalid in the presence of size differences that insure that $\Delta d$ can never vanish. A further minor modification is that a denominator $d_R^2$ in expression (84) be replaced by the original $d_R d_M$. Of course, for any split the difference registration, expression (92) remains as the final required step.

Retrying option 2 modeled for registration with global image stretching invokes the assumption that the dominant image stretching occurs in one direction (x and y) with only a smaller stretching (or none) present in the other direction. This model applies, for example, to images stretched by virtue of the original image on a paper substrate being stretched predominantly around a graphic arts scanner drum. In this case of non-isotropic image stretching, angles do not remain invariant and special treatment is required. The option 2 model is not exact (unlike the option 1 model), but involves a perturbation approximation based on the smallness of the non-dominant image stretching with respect to the dominant stretching. The result, however, is accurate to within several tenths of a mil, as testing has borne out.

For option 2, the operator specifies the dominant direction of image stretching. Only the case of dominant image stretching in the x direction will be described. The case of dominant image stretching in the y direction follows analogously.

By the perturbation assumption, $\Delta y$ is initially free from image stretching. Consequently, $\Delta x$ free (image stretching removed) from image stretching comes from equation (79) with $\Delta y$ taken from data. The split the difference correction $\Delta x_s$ is now $$\Delta x_s = \frac{-(\Delta x_{data} - \Delta x)}{2}. \tag{93}$$

Applying equation (93), $d_M$ can be recomputed with x error split to determine the residual y effect:

$$d_M' = \sqrt{(\Delta x_0 + \Delta x + \Delta x_s)^2 + (\Delta y_0 + \Delta y)^2} \quad (94)$$

Using equation (94), $\Delta y_s$ can be taken from expression (90), namely, $$\Delta y_s = \frac{(d_M' - d_R)}{2} \frac{(y_2 - y_1)}{d_R}. \quad (95)$$

The initial $\Delta y$ could have actually had some image stretching in it. The improved $\Delta y$ (in the absence of image stretching) can be computed from $\Delta y_s = -(\Delta y data - \Delta x)/2$ solved for $\Delta y$ or $$\Delta y = \Delta y_{data} + 2\Delta y_s. \quad (96)$$

The solution proceeds by repeating the computation once using $\Delta y$ of equation (96) (from iteration 1) as improved input. $\theta$ is computed on the second pass from expression (84), and $\Delta x_s$, $\Delta y_s$ for expression (92) are taken from the second pass of equations (93) and (95).

Two further refinements enhance the option 2 model of global image stretching. The first refinement is that the selection of the dominant stretching direction by the operator can be replaced automatically by an algorithmic detection step. The basis algorithm is to compute the assumed stretching in both x and y, then select that stretching as dominant that agrees most closely in magnitude with delta-d of expression (74) (which measures stretching). Thus, the computed stretching $s_x$ and $s_y$ are $$S_x = \Delta x_d - \Delta x_u = \Delta x_d + \Delta y_d \left(\frac{\Delta y_0}{\Delta x_0}\right) \quad (97)$$

$$S_y = \Delta y_d - \Delta y_u = \Delta y_d + \Delta x_d \left(\frac{\Delta x_0}{\Delta y_0}\right),$$

where $x_d$, $y_d$ are offset from data as in expression (72). $\Delta x_u$ in expression (72) is the $\Delta x$ in the absence of stretching computed from expression (79) by assuming $\Delta y_d$ is free of stretching and expanding expression (79) out to only lowest order terms (a very accurate approximation). Similarly, $\Delta y_u$ L comes from expanded expression (82) with $\Delta x_d$ taken from data.

The absolute differences $d_x$, $d_y$ are computed by $$d_x = ||s_x| - \Delta d|$$

$$d_y = ||s_y| - \Delta d|.$$

The stretching is dominant in the x direction if $$d_x \leq d_y, \quad (98)$$

in which case the assumption of validity of $d_x$ gives the best match to $\Delta_d$. If the condition of expression (98) does not hold, the dominant stretching is in the y direction. Condition (98) has been verified with test films to detect the dominant stretching direction even in the presence of significant rotation in the rough register. Note that either $\Delta x_0$ or $\Delta y_0$ becoming eery small in dominator of expression (97) leads to a situation with splitting in one direction only that is correctly predicted by expression (98) (for example, if $\Delta y_0$ becomes small, $|s_y|$ becomes large as $|s_x|$ becomes small and expression (98) is evidently satisfied, predicting stretch splitting only in the x direction).

Figure 32:
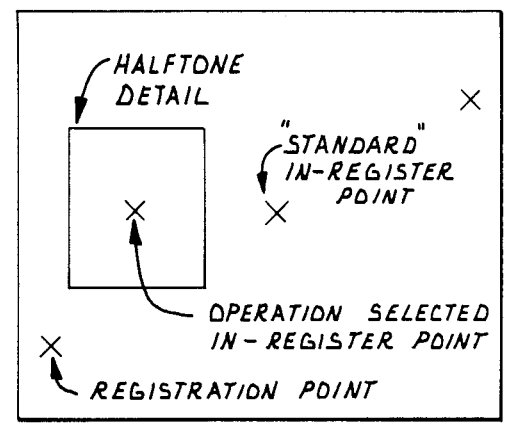
FIG. 32 is a diagrammatic illustration depicting a situation requiring operator selection of the in-register point in a split the difference registration.

The second refinement to the option 2 model of global image stretching is operator selection of the in-register point of the split the difference registration. So far it has been implicit that the in-register point in a split the difference registration lies at the center between the two registration points 1 and 2. This situation is the normal case where the desired central point of the half-tone detail coincides closely enough with the in-register point. FIG. 32 illustrates a situation requiring operator selection of the in-register point not at the center between registration points, but at the center of the halftone detail.

The step that exactly moves the in-register point to the desired location $x_c$, $y_c$ is a modification of expression (92), namely $$x_p \rightarrow x_p - \Delta x_s f_x$$

$$y_p \rightarrow y_p - \Delta y_s f_y \quad (98)$$

where the proportional scaling factors $f_x$ and $f_y$ are $$f_x = 2\left(\frac{x_c - x_2}{x_1 - x_2}\right) \quad (99)$$

$$F = \frac{2(y_c - \min(y_2, y_1))}{(\max(y_2, y_1) - \min(y_2, y_1))}$$

$$f_y = F; \quad y_1 \geq y_2$$

$$f_y = 2 - F; \quad y_1 < y_2$$

Evidently, if $x_c$, $y_c$ lies midway between registration points $x_1$, $y_1$ and $x_2$, $y_2$ then $f_x = f_y = 1$, and the original solution (92) is recovered.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, we claim:

1. In a method of registering a pair of color separation films containing halftone dot detail and macroscopic edges which align when the films are registered, the steps of:

selecting one of the films as a reference film;

recording first and second pictures of the reference film centered at spaced apart first and second locations, respectively;

recording third and fourth pictures of the other film centered at locations thereon which approximately correspond to but may be offset from the respective first and second locations;

extracting from said first and third pictures the locations of corresponding macroscopic edges on the reference film and on the other film;

extracting from said second and fourth pictures the locations of corresponding macroscopic edges on the reference film and on the other film; and determining the offset between the edge locations on the reference film and the corresponding edge locations on the other film to thereby determine the positional adjustment of the other film necessary for registration with the reference film.

2. The method of claim 1, wherein each of said extracting steps comprises:

optimally thresholding the data of each picture; and applying to the optimally thresholded data an edge detection operator adapted to detect the edge locations.

3. The method of claim 2, wherein the edge detection operator has a variable length scale determinative of the sensitivity of the operator to detect edges, and including the step of selecting a scale for the operator which is too large to allow the operator to detect edges around individual halftone dots but not too large to detect macroscopic edges in the halftone detail.

4. The method of claim 3, wherein said operator is the Laplacian of a Gaussian.

5. The method of claim 1, wherein each of said extracting steps comprises:

optimally thresholding the data of each picture;

determining the location of a plurality of edge points on each edge from the optimally thresholded data;

linking adjacent pairs of edge points on each edge to create line segments each having a length extending between two adjacent edge points;

establishing a fitting tolerance;

combining adjacent line segments with one another one at a time to create longer segments;

rejecting any line segment which exceeds the fitting tolerance; and using each rejected line segment as the initial segment of another longer segment.

6. The method of claim 5, wherein said determining step comprises using the parameter space method to match the longer segments of the reference picture and of the other picture.

7. The method of claim 6, wherein said determining step further comprises applying a least squares correction offset to the segment matches.

8. The method of claim 1, wherein each picture recorded is a digital picture and including the step of optimally thresholding the data of each picture prior to extracting the edge locations therefrom.

9. The method of claim 8, wherein each of said extracting steps comprises applying an edge detector operator to the optimally thresholded data in a manner to obtain a convolution output from which edge points on the macroscopic edges can be derived.

10. The method of claim 9, wherein each of said extracting steps further comprises sampling the convolution output systematically to obtain a reduced resolution determination of the locations of edge points on the edges of the pictures and the edge direction at each edge point.

11. The method of claim 10, including the step of interpolating to obtain an interpolated full resolution determination of the locations of edge points on the edges of the pictures.

12. The method of claim 11, wherein each of said extracting steps further comprises the step of correcting the location of each edge point for the edge bias of the operator.

13. The method of claim 12, wherein each of said extracting steps comprises producing linear segments from the edge points of each picture.

14. The method of claim 13, wherein the step of producing linear segments comprises the steps of:

linking the edge points from the reduced resolution determinations of the edge point locations in a manner to obtain line segments;

tracing the line segments to obtain distinct chains of linked edge points; and fitting said chains to segments defined by the corrected edge points of the interpolated full resolution determination.

15. The method of claim 14, wherein said fitting step comprises:

establishing a fitting tolerance;

combining neighboring line segments to create longer segments so long as each segment which is combined with others is within said tolerance;

rejecting line segments which exceed said tolerance; and using each rejected line segment as the initial segment of another longer segment obtained by combining said initial segment with additional segments within said tolerance.

16. The method of claim 15, wherein said determining step comprises using the parameter space method to match the longer segments of the reference picture and of the other picture.

17. The method of claim 16, wherein said determining step further comprises applying a least squares correction offset to the segment matches.

18. The method of claim 14, wherein said determining step comprises using the parameter space method to match the longer segments of the reference picture and of the other picture.

19. The method of claim 14, wherein said determining step comprises:

determining the length, center coordinate and angular orientation of each fitted chain of linked edge points;

comparing the angular orientations of each fitted chain of the reference picture with each possibly matching fitted chain of the other picture;

accepting pairs of fitted chains that do not differ in angular orientation by more than a prescribed threshold value;

constructing a rectangular painting window centered at a location determined by the offset between the center coordinates of each accepted pair of fitted chains, each window having a preselected width and a length and angular orientation determined by the lengths and angular orientations of the fitted chains in each accepted pair;

assigning to each coordinate point in a preselected coordinate frame a score based on the number of painting windows the coordinate falls within; and determining the offset by ascertaining the coordinate point having the highest score.

20. The method of claim 19, including the step of correcting said offset for size differences between the reference picture and the other picture.

21. The method of claim 20, wherein said correcting step comprises applying to said offset a least squares correction offset.

22. Apparatus for effecting registration between a pair of color separation films containing halftone dot detail and macroscope edges which align when the films are registered, said apparatus comprising:
- a digital camera operable to record digital pictures at locations on each film with the locations on the respective films corresponding but possibly being offset;
- means for extracting from each digital picture the locations of macroscopic edges thereon; and
- means for calculating the offset between the edges on corresponding pictures of the films thereby determining the relative movement necessary to bring the films into registration.

23. Apparatus as set forth in claim 22, wherein said extracting means comprises:
- means for optimally thresholding the data of each picture; and
- means for applying to the optimally thresholded data an edge detection operator characterized by the ability to detect the locations of edges in the pictures.

24. Apparatus as set forth in claim 23, wherein the edge detection operator is characterized by a variable length scale determinative of the sensitivity of the operator to detect edges, said scale being too large to detect edges around individual halftone dots but not too large to detect macroscopic edges in the halftone detail.

25. Apparatus as set forth in claim 24, wherein the edge detection operator is the Laplacian of a Gaussian.

26. Apparatus as set forth in claim 22, wherein said extracting means comprises:
- means for optimally thresholding the data of each picture;
- means for locating a plurality of edge points on each edge of the optimally thresholded data;
- means for using the edge points to create line segments extending between the edge points; and
- means for combining the line segments with one another one at a time to create longer segments so long as each added segment is within a predetermined fitting tolerance.

27. Apparatus as set forth in claim 26, wherein said means for locating comprises means for applying the parameter space method to the data.

28. Apparatus as set forth in claim 27, including means for applying to the data a least squares correction offset.

29. Apparatus as set forth in claim 22, wherein said extracting means comprises:
- means for optimally thresholding the data of each picture;
- means for applying an edge detection operator to the optimally thresholded data to locate points on the edge; and
- means for systematically sampling the points located by application of said operator to provide a reduced resolution determination of the edge point locations and the edge direction at each edge point location.

30. Apparatus as set forth in claim 29, including means for interpolating said reduced resolution determination to provide an interpolated full resolution determination of the edge point locations.

31. Apparatus as set forth in claim 30, including means for correcting the location of each edge point in said full resolution determination for the edge bias of said operator.

32. Apparatus as set forth in claim 29, including means for producing linear segments from the edge points of each picture.

33. Apparatus as set forth in claim 32, wherein said linear segment producing means comprises:
- means for linking the edge points from said reduced resolution determination in a manner to provide line segments from the linked edge points;
- means for tracing said line segments to provide distinct chains of linked edge points;
- means for interpolating said reduced resolution determination to provide an interpolated full resolution determination of the edge point locations; and
- means for fitting said chains to line segments defined by the edge point locations of said full resolution determination.

34. Apparatus as set forth in claim 33, wherein said calculating means comprises:
- means for determining the length, center coordinate and angular orientation of each fitted chain;
- means for accepting as possibly matching pairs all pairs of chains that are within a prescribed angular orientation of one another;
- means for constructing at a location determined by the offset between the center coordinates of each possibly matching pair of chains a rectangular painting window having a preselected length and width and an angular orientation dependent upon the lengths and angular orientations of the fitted chains in each possibly matching pair; and
- means for assigning a score to each coordinate point in a preselected coordinate frame based on the number of said painting windows the coordinate point falls within, whereby the coordinate point having the highest score can be considered to be said offset.

35. Apparatus as set forth in claim 34, including means for correcting said offset for size differences between the corresponding pictures of the two films.

36. Apparatus as set forth in claim 35, including least squares correction means for correcting said offset for size differences between the corresponding pictures of the two films.

37. In a method of registering a pair of color separation films containing halftone dot detail and macroscopic edges which align when the films are registered, the step of:
- selecting one of the films as a reference film;
- recording first and second pictures of the reference film centered at spaced apart first and second locations, respectively;
- recording third and fourth pictures of the other film centered at locations thereon which approximately correspond to but may be offset from the respective first and second locations;
- extracting from said first and third pictures the locations of corresponding macroscopic edges on the reference film and on the other film;
- extracting from said second and fourth pictures the locations of corresponding macroscopic edges on the reference film and on the other film;
- determining the offsets between the edge locations on the reference film and the corresponding edge locations on the other film required to separately move the first picture into registration with the third picture and the second picture into registration with the fourth picture;

constructing a imaginary line vector extending from a tail point at one selected location on the reference film and a tip point at another selected location on the reference film;

computing a tail point on the other film by subtracting the corresponding offset from the coordinates of said one selected location;

computing a tip point on the other film by subtracting the corresponding offset from the coordinates of said other selected location; and constructing an imaginary line vector extending from said tail point on the other film to said tip point on the other film whereby the positional adjustment of the other film necessary to register it with the reference film can be effected by aligning the vector on the other film with the vector on the reference film.

38. The method of claim 37, wherein one of said vectors is shorter than the other, and including the step of effecting registration of said other film with said reference film by positioning the other film such that the shorter vector is aligned with and centered on the other vector, thereby equalizing the error in the vector lengths at both ends of the vectors to split the difference in the error.

39. The method of claim 37, wherein the vectors differ in length and including the steps of:

determining the difference in length of the vectors; and aborting the registration if the difference in length of the vectors exceeds a preselected tolerance.

* * * * *